(12) United States Patent
Yoneda et al.

(10) Patent No.: US 12,132,060 B2
(45) Date of Patent: Oct. 29, 2024

(54) IMAGING DEVICE AND ELECTRONIC DEVICE

(71) Applicant: Semiconductor Energy Laboratory Co., Ltd., Atsugi (JP)

(72) Inventors: Seiichi Yoneda, Isehara (JP); Yusuke Negoro, Kaizuka (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 424 days.

(21) Appl. No.: 17/617,016

(22) PCT Filed: Jun. 5, 2020

(86) PCT No.: PCT/IB2020/055289
§ 371 (c)(1),
(2) Date: Dec. 7, 2021

(87) PCT Pub. No.: WO2020/250095
PCT Pub. Date: Dec. 17, 2020

(65) Prior Publication Data
US 2022/0238582 A1     Jul. 28, 2022

(30) Foreign Application Priority Data

Jun. 14, 2019  (JP) ................................ 2019-110943

(51) Int. Cl.
*H04N 25/00*        (2023.01)
*H01L 27/146*       (2006.01)
(Continued)

(52) U.S. Cl.
CPC .. *H01L 27/14614* (2013.01); *H01L 27/14616* (2013.01); *H01L 27/14636* (2013.01);
(Continued)

(58) Field of Classification Search
CPC ......... H01L 27/14614; H01L 27/14616; H01L 27/14636; H01L 27/146; H01L 27/14612;
(Continued)

(56) References Cited

U.S. PATENT DOCUMENTS

| 8,378,391 B2 | 2/2013 | Koyama et al. |
| 8,916,869 B2 | 12/2014 | Koyama et al. |

(Continued)

FOREIGN PATENT DOCUMENTS

| CN | 110651468 A | 1/2020 |
| CN | 110832845 A | 2/2020 |

(Continued)

OTHER PUBLICATIONS

International Search Report (Application No. PCT/IB2020/055289) Dated Sep. 8, 2020.

(Continued)

*Primary Examiner* — Nhan T Tran
(74) *Attorney, Agent, or Firm* — Eric J. Robinson; Robinson Intellectual Property Law Office, P.C.

(57) ABSTRACT

An imaging device capable of image processing is provided. The imaging device can retain analog data (image data) obtained by an image-capturing operation in a pixel and extract data obtained by multiplying the analog data by a predetermined weight coefficient. When the data is taken in a neural network or the like, processing such as image recognition can be performed. Since enormous volumes of image data can be retained in pixels in the state of analog data, processing can be performed efficiently.

16 Claims, 21 Drawing Sheets

(51) Int. Cl.
*H04N 23/63* (2023.01)
*H04N 25/77* (2023.01)
*H04N 25/78* (2023.01)

(52) U.S. Cl.
CPC .............. *H04N 25/00* (2023.01); *H04N 25/77* (2023.01); *H04N 25/78* (2023.01); *H04N 23/63* (2023.01)

(58) Field of Classification Search
CPC ......... H01L 27/14621; H01L 27/14627; H01L 27/14643; H04N 25/00; H04N 25/77; H04N 25/78; H04N 23/63; H04N 25/75; H04N 25/76; H04N 25/766
See application file for complete search history.

(56) References Cited

U.S. PATENT DOCUMENTS

| | | | |
|---|---|---|---|
| 9,331,112 B2 | 5/2016 | Koyama et al. | |
| 9,773,814 B2 | 9/2017 | Koyama et al. | |
| 9,773,832 B2 | 9/2017 | Kurokawa | |
| 10,074,687 B2 | 9/2018 | Kurokawa | |
| 10,600,839 B2 | 3/2020 | Kurokawa | |
| 10,951,850 B2 | 3/2021 | Yamamoto et al. | |
| 10,964,743 B2 | 3/2021 | Kurokawa | |
| 11,101,302 B2 | 8/2021 | Ikeda et al. | |
| 2019/0043900 A1* | 2/2019 | Oka | H04N 25/59 |
| 2020/0145600 A1* | 5/2020 | Yamamoto | H01L 27/14636 |
| 2020/0176493 A1* | 6/2020 | Ikeda | H01L 27/14621 |
| 2021/0233952 A1 | 7/2021 | Kurokawa | |
| 2021/0384239 A1 | 12/2021 | Ikeda et al. | |

FOREIGN PATENT DOCUMENTS

| | | | |
|---|---|---|---|
| EP | 3654635 A | 5/2020 | |
| JP | 2011-119711 A | 6/2011 | |
| JP | 2016-123087 A | 7/2016 | |
| KR | 2020-0012917 A | 2/2020 | |
| WO | WO-2018/215882 | 11/2018 | |
| WO | WO-2018215882 A1 * | 11/2018 | ......... H01L 27/1225 |
| WO | WO-2018/224910 | 12/2018 | |
| WO | WO-2019/012369 | 1/2019 | |

OTHER PUBLICATIONS

Written Opinion (Application No. PCT/IB2020/055289) Dated Sep. 8, 2020.

* cited by examiner

FIG. 20A1
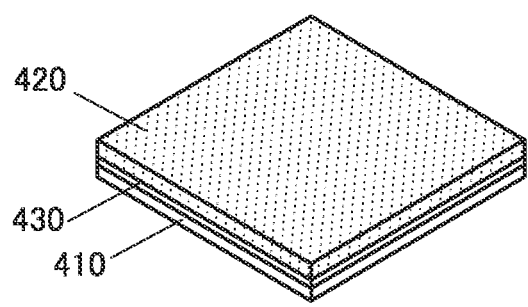
FIG. 20B1
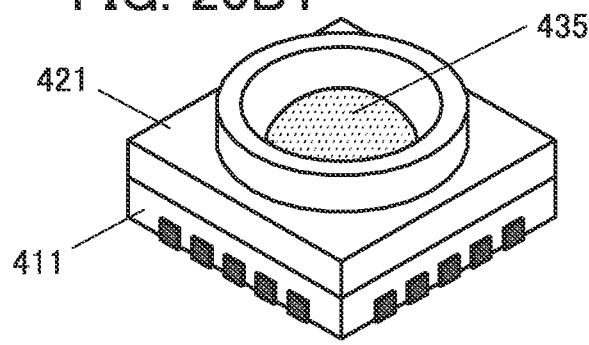
FIG. 20A2
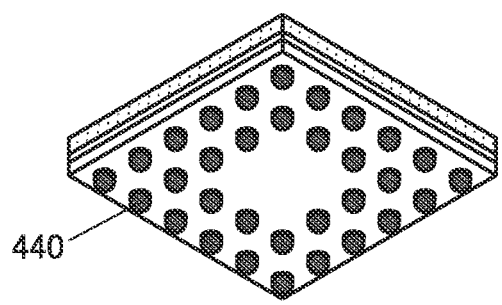
FIG. 20B2
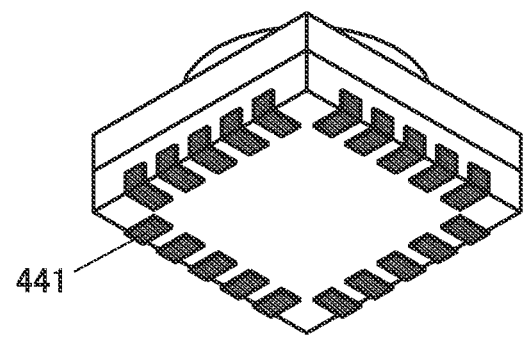
FIG. 20A3
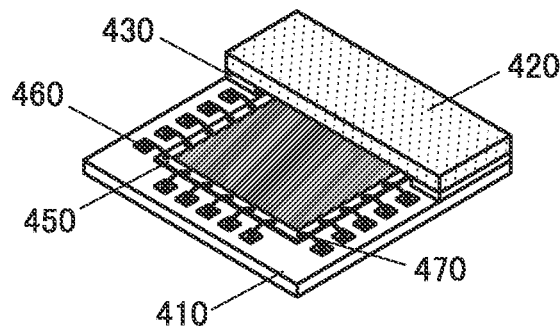
FIG. 20B3
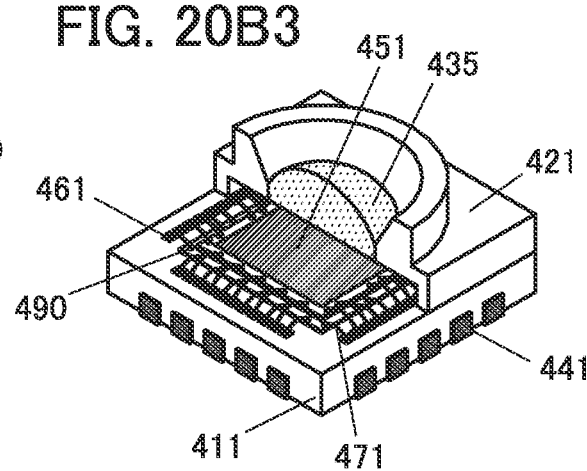

IMAGING DEVICE AND ELECTRONIC DEVICE

TECHNICAL FIELD

One embodiment of the present invention relates to an imaging device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, an imaging device, a driving method thereof, and a manufacturing method thereof.

In this specification and the like, a semiconductor device generally means a device that can function by utilizing semiconductor characteristics. A transistor and a semiconductor circuit are embodiments of semiconductor devices. In some cases, a memory device, a display device, an imaging device, or an electronic device includes a semiconductor device.

BACKGROUND ART

A technique for forming a transistor using an oxide semiconductor thin film formed over a substrate has attracted attention. For example, an imaging device with a structure in which a transistor including an oxide semiconductor and having an extremely low off-state current is used in a pixel circuit is disclosed in Patent Document 1.

A technique which adds an arithmetic function to an imaging device is disclosed in Patent Document 2.

REFERENCES

Patent Documents

[Patent Document 1] Japanese Published Patent Application No. 2011-119711
[Patent Document 2] Japanese Published Patent Application No. 2016-123087

SUMMARY OF THE INVENTION

Problems to be Solved by the Invention

With the technological development, a high-quality image can be easily captured by an imaging device provided with a solid-state imaging element such as a CMOS image sensor. In the next generation, an imaging device is required to be equipped with more intelligent functions.

In the present image data compression, image recognition, or the like, image data (analog data) is converted into digital data, taken out, and then subjected to processing. If the processing can be carried out in the imaging device, higher-speed communication with an external device is achieved, improving user's convenience. Furthermore, load and power consumption of a peripheral device or the like can be reduced. Moreover, if complicated data processing is performed in an analog data state, time required for data conversion can be shortened.

Thus, an object of one embodiment of the present invention is to provide an imaging device capable of image processing. Another object is to provide an imaging device with low power consumption. Another object is to provide a highly reliable imaging device. Another object is to provide a novel imaging device or the like. Another object is to provide a method for driving the above-described imaging device. Another object is to provide a novel semiconductor device or the like.

Note that the description of these objects does not preclude the existence of other objects. One embodiment of the present invention does not have to achieve all these objects. Other objects are apparent from and can be derived from the description of the specification, the drawings, the claims, and the like.

Means for Solving the Problems

One embodiment of the present invention relates to an imaging device which can retain data in a pixel and perform arithmetic processing on the data.

One embodiment of the present invention is an imaging device including a pixel, a first circuit, and a second circuit. The first circuit has a function of supplying a first potential or a second potential to the pixel; the second potential is a potential obtained by adding a weight to the first potential; the pixel has a function of generating first data; when the first potential is supplied from the first circuit to the pixel, the pixel has a function of outputting second data to the second circuit on the basis of the first data and the first potential; when the second potential is supplied from the first circuit to the pixel, the pixel has a function of outputting third data to the second circuit on the basis of the first data and the second potential; and the second circuit has a function of generating fourth data corresponding to a difference between the second data and the third data.

Another embodiment of the present invention is an imaging device including a pixel, a first circuit, a second circuit, and a third circuit. The first circuit has a function of supplying a first potential or a second potential to the pixel; the second potential is a potential obtained by adding a weight to the first potential; the pixel has a function of generating first data or second data; when the first potential is supplied from the first circuit to the pixel, the pixel has a function of outputting third data to the second circuit on the basis of the first data and the first potential and the pixel has a function of outputting fourth data to the second circuit on the basis of the second data and the first potential; when the second potential is supplied from the first circuit to the pixel, the pixel has a function of outputting fifth data to the second circuit on the basis of the first data and the second potential and the pixel has a function of outputting sixth data to the second circuit on the basis of the second data and the second potential; the second circuit has a function of generating seventh data corresponding to a difference between the third data and the fourth data and outputting the seventh data to the third circuit; the second circuit has a function of generating eighth data corresponding to a difference between the fifth data and the sixth data and outputting the eighth data to the third circuit; and the third circuit generates ninth data corresponding to a difference between the seventh data and the eighth data.

The pixel can include a photoelectric conversion device, a first transistor, a second transistor, a third transistor, a fourth transistor, and a first capacitor; one electrode of the photoelectric conversion device can be electrically connected to one of a source and a drain of the first transistor;

the other of the source and the drain of the first transistor can be electrically connected to one of a source and a drain of the second transistor; one of a source and a drain of the second transistor can be electrically connected to a gate of the third transistor; the gate of the third transistor can be electrically connected to one electrode of the first capacitor; the other electrode of the first capacitor can be electrically connected to one of a source and a drain of the fourth transistor; the other of the source and the drain of the fourth transistor can be electrically connected to the first circuit; and one of a source and a drain of the third transistor can be electrically connected to the second circuit.

Alternatively, the pixel can include a photoelectric conversion device, a first transistor, a second transistor, a third transistor, a fourth transistor, and a first capacitor; one electrode of the photoelectric conversion device can be electrically connected to one of a source and a drain of the first transistor; the other of the source and the drain of the first transistor can be electrically connected to one of a source and a drain of the second transistor; one of a source and a drain of the second transistor can be electrically connected to a first gate of the third transistor; the first gate of the third transistor can be electrically connected to one electrode of the first capacitor; the other electrode of the first capacitor can be electrically connected to the first circuit; a second gate of the third transistor can be electrically connected to one of a source and a drain of the fourth transistor; and one of a source and a drain of the third transistor can be electrically connected to the second circuit.

The first circuit can supply one of the first potential and the second potential to the other electrode of the first capacitor and can supply the other of the first potential and the second potential to the other of the source and the drain of the fourth transistor.

The third transistor can be brought into an on state when a potential higher than or equal to the first potential is supplied to the other electrode of the first capacitor.

The second circuit can include a fifth transistor, a sixth transistor, a seventh transistor, an eighth transistor, a second capacitor, and a resistor; one electrode of the second capacitor can be electrically connected to the pixel; the one electrode of the second capacitor can be electrically connected to the resistor; the other electrode of the second capacitor can be electrically connected to one of a source and a drain of the fifth transistor; the one of the source and the drain of the fifth transistor can be electrically connected to a gate of the sixth transistor; one of a source and a drain of the sixth transistor can be electrically connected to one of a source and a drain of the seventh transistor; and the one of the source and the drain of the seventh transistor can be electrically connected to one of a source and a drain of the eighth transistor.

A transistor included in the pixel can include a metal oxide in a channel formation region, and the metal oxide can contain In, Zn, and M (M is Al, Ti, Ga, Ge, Sn, Y, Zr, La, Ce, Nd, or Hf).

Effect of the Invention

With one embodiment of the present invention, an imaging device capable of image processing can be provided. An imaging device with low power consumption can be provided. A highly reliable imaging device can be provided. A novel imaging device or the like can be provided. A method for driving the above-described imaging device can be provided. A novel semiconductor device or the like can be provided.

BRIEF DESCRIPTION OF THE DRAWINGS

FIG. 20A1 to FIG. 20A3 and FIG. 20B1 to FIG. 20B3 are perspective views of a package and a module in which an imaging device is placed.

MODE FOR CARRYING OUT THE INVENTION

Figure 1:
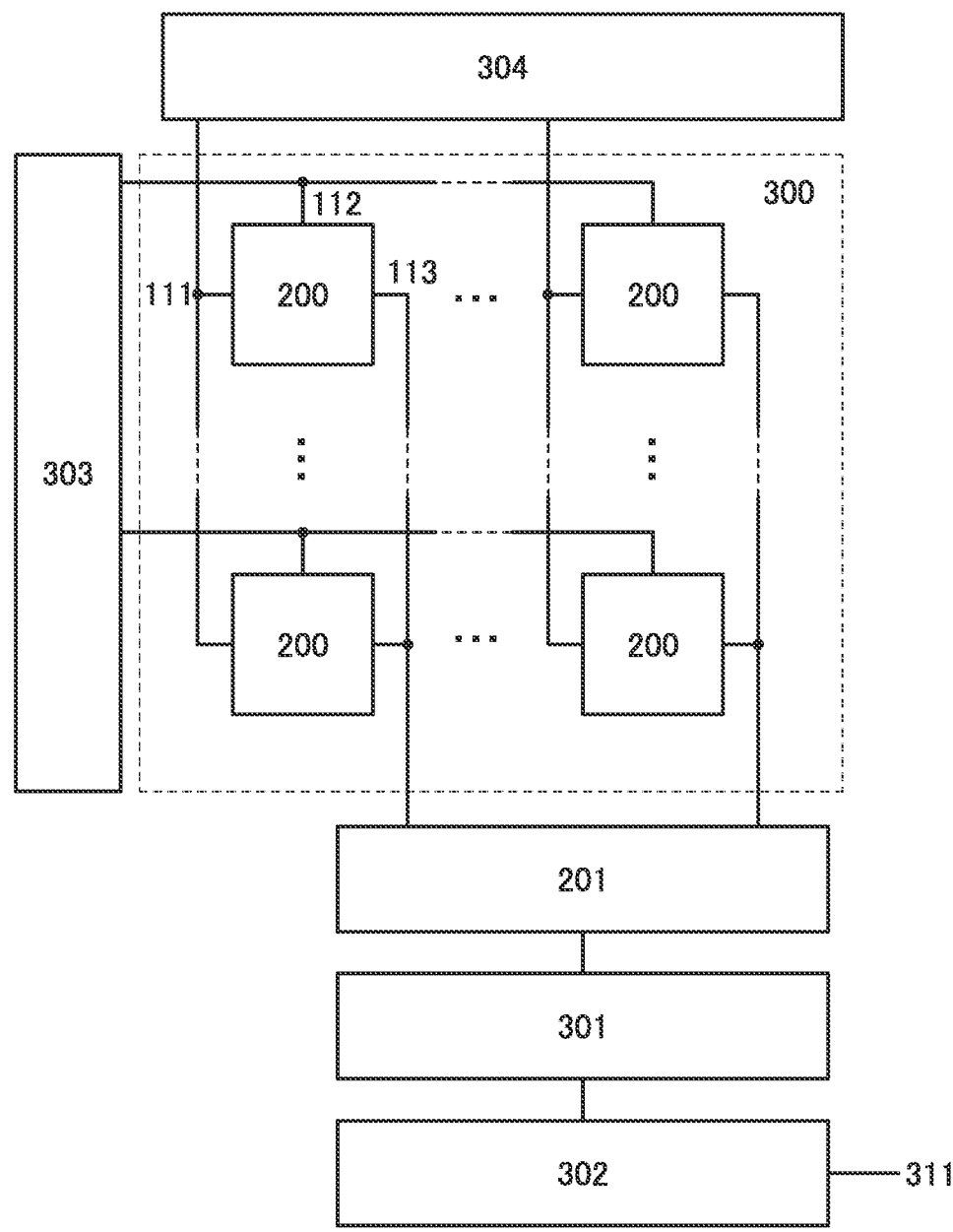
FIG. 1 is a block diagram illustrating an imaging device.

Embodiments are described in detail with reference to the drawings. However, the present invention is not limited to the following description, and it is readily appreciated by those skilled in the art that modes and details can be modified in various ways without departing from the spirit and the scope of the present invention. Therefore, the present invention should not be interpreted as being limited to the descriptions of embodiments below. Note that in structures of the invention described below, the same portions or portions having similar functions are denoted by the same reference numerals in different drawings, and the description thereof is not repeated in some cases. The same components are denoted by different hatching patterns in different drawings, or the hatching patterns are omitted in some cases.

Even in the case where a single component is illustrated in a circuit diagram, the component may be composed of a plurality of parts as long as there is no functional inconvenience. For example, in some cases, a plurality of transistors that operate as a switch are connected in series or in parallel. In some cases, capacitors are divided and arranged in a plurality of positions.

One conductor has a plurality of functions such as a wiring, an electrode, and a terminal in some cases. In this specification, a plurality of names are used for the same component in some cases. Even in the case where elements are illustrated in a circuit diagram as if they were directly connected to each other, the elements may actually be connected to each other through one conductor or a plurality of conductors. In this specification, even such a structure is included in direct connection.

Embodiment 1

In this embodiment, an imaging device of one embodiment of the present invention is described with reference to drawings.

One embodiment of the present invention is an imaging device having an additional function such as image recognition. The imaging device can retain analog data (image data) obtained by an image-capturing operation in a pixel and extract data obtained by multiplying the analog data by a predetermined weight coefficient.

When the data is taken in a neural network or the like, processing such as image recognition can be performed. Since enormous volumes of image data can be retained in pixels in the state of analog data, processing can be performed efficiently.

In general, selection of pixels is performed by controlling the electrical conduction of selection transistors provided in the pixels; however, on-state resistance of the selection transistors serves as parasitic resistance and may cause noise. One embodiment of the present invention makes a selection operation possible without selection transistors provided. Thus, pixels can output image data with few noise components. Moreover, a product-sum operation can be performed with high accuracy.

FIG. 1 is a block diagram illustrating an imaging device of one embodiment of the present invention. The imaging device includes a pixel array 300, a circuit 201, a circuit 301, a circuit 302, a circuit 303, and a circuit 304. Note that the structures of the circuit 201 and the circuit 301 to the circuit 304 are not limited to single circuits and may each consist of a plurality of circuits. Furthermore, any of two or more of the circuits described above may be combined.

The pixel array 300 has an image-capturing function and an arithmetic function. The circuits 201 and 301 each have an arithmetic function. The circuit 302 has an arithmetic function or a data conversion function. The circuit 303 has a selection function. The circuit 304 has a function of supplying a potential for an arithmetic operation to pixels and a selection function. As a circuit having a selection function, a shift register, a decoder, or the like can be used.

Figure 2:
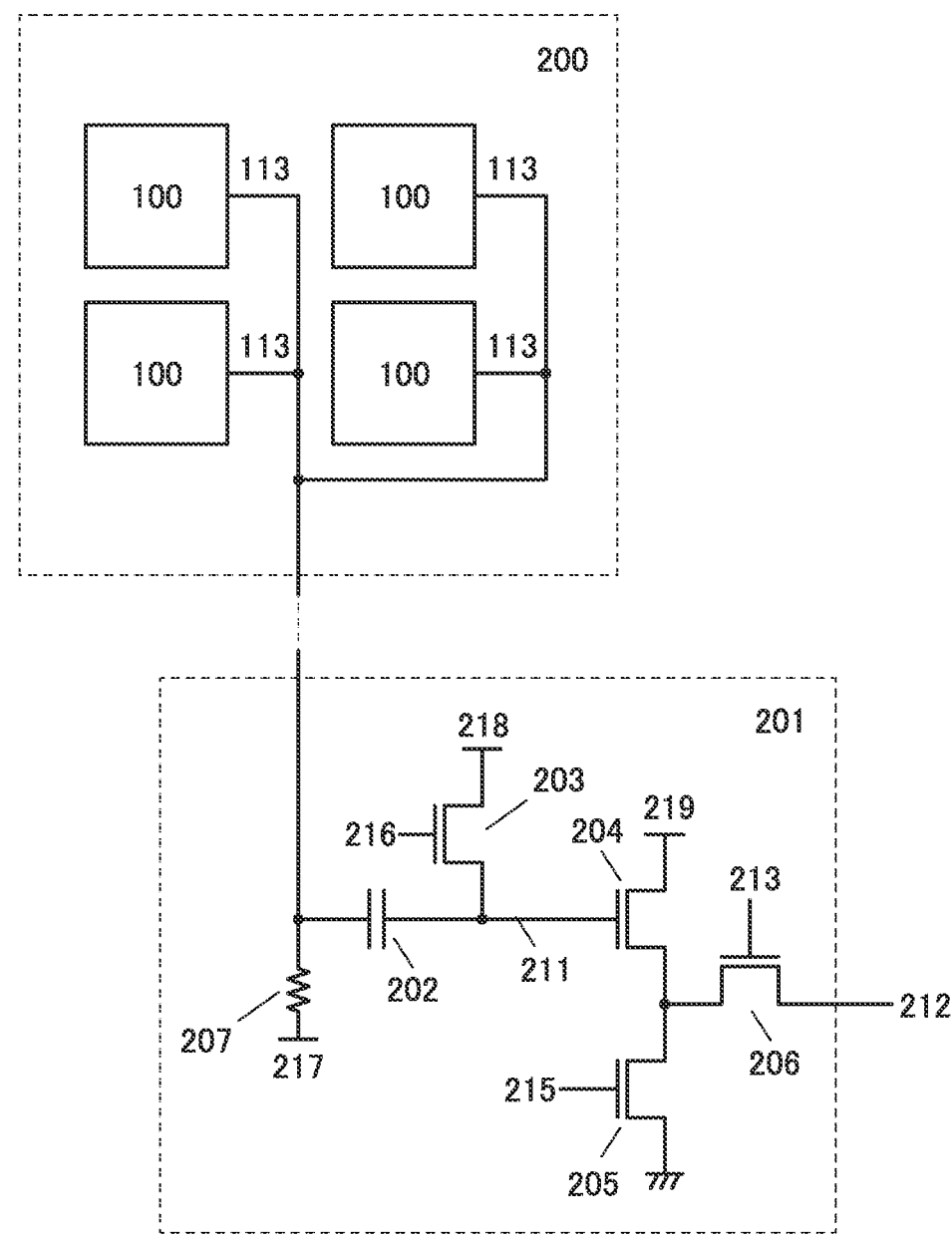
FIG. 2 is a diagram illustrating a pixel block 200 and a circuit 201.

The pixel array 300 includes a plurality of pixel blocks 200. As illustrated in FIG. 2, the pixel block 200 includes a plurality of pixels 100 arranged in a matrix, and each of the pixels 100 is electrically connected to the circuit 201. Note that the circuit 201 can also be provided in the pixel block 200.

The pixels 100 can obtain image data and generate data obtained by adding the image data and a weight coefficient. Note that the number of pixels is 2×2 in an example illustrated in FIG. 2 but is not limited to this. For example, the number of pixels can be 3×3, 4×4, or the like. Alternatively, the number of pixels in the horizontal direction and the number of pixels in the vertical direction may differ from each other.

The pixel block 200 and the circuit 201 can operate as a product-sum operation circuit. The circuit 201 also has a function of a correlated double sampling circuit (CDS circuit).

Figure 3A:
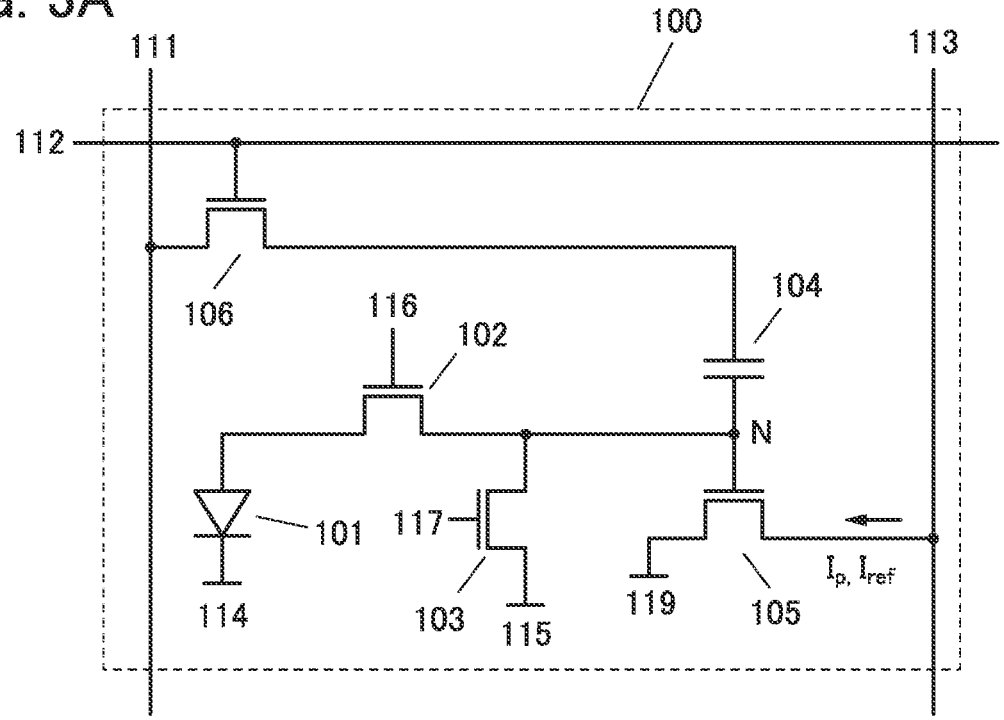
FIG. 3A and FIG. 3B are diagrams illustrating a pixel 100.

As illustrated in FIG. 3A, the pixel 100 can include a photoelectric conversion device 101, a transistor 102, a transistor 103, a capacitor 104, a transistor 105, and a transistor 106.

One electrode of the photoelectric conversion device 101 is electrically connected to one of a source and a drain of the transistor 102. The other of the source and the drain of the transistor 102 is electrically connected to one of a source and a drain of the transistor 103. The one of the source and the drain of the transistor 103 is electrically connected to one electrode of the capacitor 104. The one electrode of the capacitor 104 is electrically connected to a gate of the transistor 105. The other electrode of the capacitor 104 is electrically connected to one of a source and a drain of the transistor 106.

The other electrode of the photoelectric conversion device 101 is electrically connected to a wiring 114. A gate of the transistor 102 is electrically connected to a wiring 116. The other of the source and the drain of the transistor 103 is electrically connected to a wiring 115. A gate of the transistor 103 is electrically connected to a wiring 117. One of a source and a drain of the transistor 105 is electrically connected to a wiring 119. The other of the source and the drain of the transistor 105 is electrically connected to a wiring 113. The other of the source and the drain of the transistor 106 is electrically connected to a wiring 111. A gate of the transistor 106 is electrically connected to a wiring 112.

Here, a point where the other of the source and the drain of the transistor 102, the one of the source and the drain of the transistor 103, the one electrode of the capacitor 104, and the gate of the transistor 105 are electrically connected is referred to as a node N.

The wirings 114 and 115 can each have a function of a power supply line. For example, the wiring 114 can function as a high potential power supply line, and the wiring 115 can function as a low potential power supply line. The wirings 112, 116, and 117 can function as signal lines for controlling the electrical conduction of the respective transistors. The wiring 111 can function as a wiring which supplies a potential corresponding to the weight coefficient or a potential for controlling the electrical conduction of the transistor 105 to the pixel 100. The wiring 113 can function as a wiring which electrically connects the pixel 100 and the circuit 201.

Note that an amplifier circuit or a gain control circuit may be electrically connected to the wiring 113.

As the photoelectric conversion device 101, a photodiode can be used. In order to increase the light detection sensitivity under low illuminance conditions, an avalanche photodiode is preferably used.

The transistor 102 can have a function of controlling the potential of the node N. The transistor 103 can have a function of initializing the potential of the node N. The transistor 105 can have a function of controlling a current fed by the circuit 201 in accordance with the potential of the node N. The transistor 106 can have a function of supplying the potential corresponding to the weight coefficient to the node N.

In the structure illustrated in FIG. 3A, a selection operation of the pixel 100 is performed by turning on the transistor

106, supplying a certain potential ($W_{base}$), from the wiring 111, changing the potential of the node N by capacitive coupling of the capacitor 104, and turning on the transistor 105.

Therefore, conditions that the transistor 105 is not brought into an on state in a period when the potential of the node N is initialized to the potential of the wiring 115 (reset period) and a period when the potential of the node N is changed (+X) by an operation of the photoelectric conversion device 101 (accumulation period), are set. Specifically, the potential of the wiring 114 (VP), the potential of the wiring 115 (VRS), and the potential of the wiring 119 (VPI) are set to values which do not bring the transistor 105 into an on state.

The potential of the node N becomes VRS in the reset period, and VRS+X in the accumulation period. The maximum value of X is not larger than the value of VP; therefore, the maximum value of the potential of the node N in the accumulation period can be regarded as VP. Thus, the potential of the wiring 114 (VP), the potential of the wiring 115 (VRS), and the potential of the wiring 119 (VPI) are set to achieve VP−VPI<$V_{th}$, where the threshold voltage of the transistor 105 is $V_{th}$.

In a selection period (reading period) of the pixel 100, a potential which makes the difference between the potential of the node N and the potential of the wiring 119 (VPI) larger than or equal to the threshold voltage of the transistor 105 ($V_{th}$) is supplied to the wiring 111. In other words, a voltage which allows $W_{base}$−VPI≥$V_{th}$ to be satisfied is used as the potential of the wiring 111 ($W_{base}$). Note that the potential ($W_{base}$) to which a potential (W) is added can also be supplied to the wiring 111. The potential (W) corresponds to a weight of a product-sum operation and will be described in detail later.

Figure 3B:
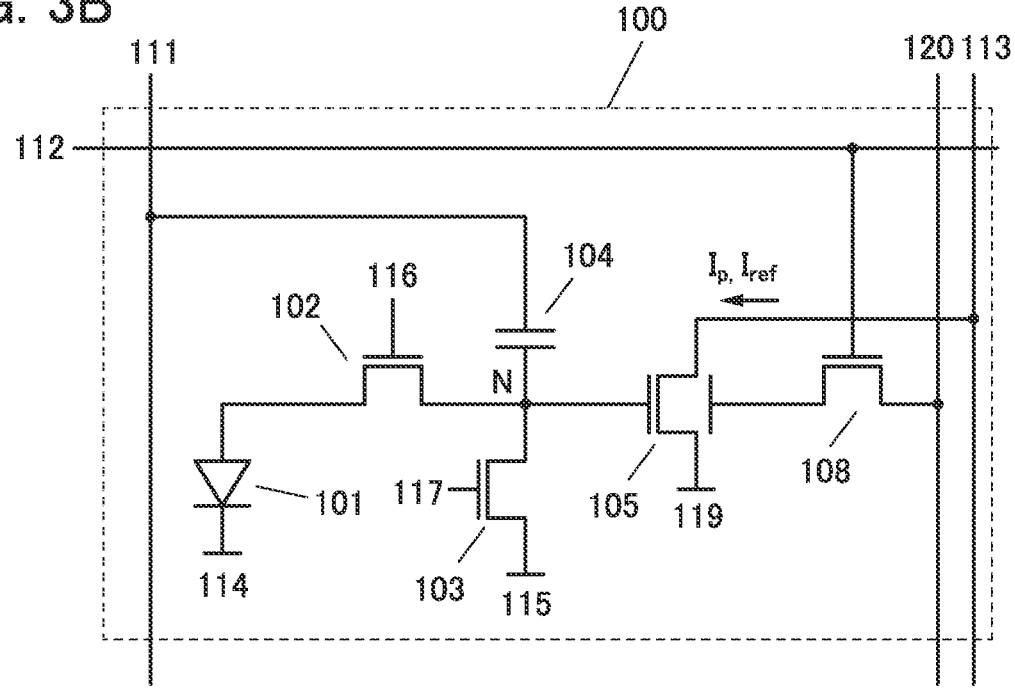

The pixel 100 may also have a structure illustrated in FIG. 3B. The structure illustrated in FIG. 3B is different from the structure of FIG. 3A in that the transistor 106 is not provided and a transistor 108 is provided. In the structure illustrated in FIG. 3B, the other electrode of the capacitor 104 is electrically connected to the wiring 111. In addition, one of a source and a drain of the transistor 108 is electrically connected to a back gate of the transistor 105. The other of the source and the drain of the transistor 108 is electrically connected to a wiring 120.

In the structure, the electrical conduction of the transistor 105 can be controlled by supplying the potential ($W_{base}$) from one of the wiring 111 and the wiring 120. The potential (W) can be supplied from the other of the wiring 111 and the wiring 120.

In the case where an avalanche photodiode is used as the photoelectric conversion device 101, a high voltage is sometimes applied and thus a transistor with a high withstand voltage is preferably used as a transistor connected to the photoelectric conversion device 101. As the transistor with a high withstand voltage, a transistor using a metal oxide in its channel formation region (hereinafter, an OS transistor) or the like can be used, for example. Specifically, an OS transistor is preferably used as the transistor 102.

The OS transistor also has a feature of an extremely low off-state current. When OS transistors are used as the transistors 102, 103, and 106, the charge retention period of the node N can be lengthened greatly. Therefore, a global shutter mode in which a charge accumulation operation is performed in all the pixels at the same time can be used without complicating the circuit structure and operation method. Furthermore, while image data is retained at the node N, an arithmetic operation using the image data can be performed a plurality of times.

Meanwhile, it is desired that the transistor 105 have excellent amplifying characteristics. Accordingly, a transistor using silicon in its channel formation region (hereinafter, a Si transistor) is preferably used as the transistor 105. As a transistor which is repeatedly turned on and off at frequent intervals, a transistor having a high mobility capable of a high-speed operation is preferably used. Accordingly, a Si transistor may be used as the transistor 106.

Note that without limitation to the above, an OS transistor and a Si transistor may be freely used in combination. Alternatively, all the transistors may be OS transistors. Alternatively, all the transistors may be Si transistors. Examples of the Si transistor include a transistor including amorphous silicon and a transistor including crystalline silicon (microcrystalline silicon, low-temperature polysilicon, or single crystal silicon).

The potential of the node N in the pixel 100 has a value obtained by capacitive coupling between a potential obtained by adding the potential (VRS: reset potential) supplied from the wiring 115 and the potential (X: image data) generated by photoelectric conversion by the photoelectric conversion device 101 and the potential ($W_{base}$) or a potential ($W_{base}$+W) including the potential corresponding to a weight coefficient, which is supplied from the wiring 111. That is, a current corresponding to data in which a given weight coefficient (W) is added to the image data (X) can flow through the transistor 105.

As illustrated in FIG. 2, the pixels 100 are electrically connected to each other through the wiring 113. The circuit 201 can perform an arithmetic operation using the sum of the currents flowing through the transistors 105 of the pixels 100.

The circuit 201 includes a capacitor 202, a transistor 203, a transistor 204, a transistor 205, a transistor 206, and a resistor 207.

One electrode of the capacitor 202 is electrically connected to one of a source and a drain of the transistor 203. The one of the source and the drain of the transistor 203 is electrically connected to a gate of the transistor 204. One of a source and a drain of the transistor 204 is electrically connected to one of a source and a drain of the transistor 205. The one of the source and the drain of the transistor 205 is electrically connected to one of a source and a drain of the transistor 206. One electrode of the resistor 207 is electrically connected to the other electrode of the capacitor 202.

The other electrode of the capacitor 202 is electrically connected to the wiring 113. The other of the source and the drain of the transistor 203 is electrically connected to a wiring 218. The other of the source and the drain of the transistor 204 is electrically connected to a wiring 219. The other of the source and the drain of the transistor 205 is electrically connected to a reference power supply line such as a GND wiring. The other of the source and the drain of the transistor 206 is electrically connected to a wiring 212. The other electrode of the resistor 207 is electrically connected to a wiring 217.

The wirings 217, 218, and 219 can each have a function of a power supply line. For example, the wiring 218 can have a function of a wiring which supplies a potential dedicated to reading. The wirings 217 and 219 can function as high potential power supply lines. The wirings 213, 215, and 216 can function as signal lines for controlling the electrical conduction of the respective transistors. The wiring 212 is an output line and can be electrically connected to the circuit 301 illustrated in FIG. 1, for example.

The transistor 203 can have a function of resetting the potential of the wiring 211 to the potential of the wiring 218.

The transistors 204 and 205 can function as source follower circuits. The transistor 206 can have a function of controlling a reading operation. The resistor 207 can have a function of an I-V converter circuit.

In one embodiment of the present invention, offset components other than the product of image data (X) and the weight coefficient (W) are eliminated and an objective WX is extracted. WX can be calculated using data obtained when image capturing is performed, data obtained when image capturing is not performed, and data obtained by supplying weights to the respective data.

The total amount of the currents ($I_p$) flowing through the pixels 100 when image capturing is performed is $k\Sigma(X+VRS+W_{base}-VPI-V_{th})^2$, and the total amount of the currents ($I_p$) flowing through the pixels 100 when weights are supplied is $k\Sigma(W+X+VRS+W_{base}-VPI-V_{th})^2$. The total amount of the currents ($I_{ref}$) flowing through the pixels 100 when image capturing is not performed is $k\Sigma(0+VRS+W_{base}-VPI-V_{th})^2$, and the total amount of currents ($I_{ref}$) flowing through the pixels 100 when weights are supplied is $k\Sigma(W+VRS+W_{base}-VPI-V_{th})^2$. Here, k is a constant and $V_{th}$ is the threshold voltage of the transistor 105.

First, a difference (data A) between the data obtained when image capturing is performed and the data obtained by supplying weights to the data is calculated. The difference is $k\Sigma((X+VRS+W+W_{base}-VPI-V_{th})^2-(W+X+VRS+W_{base}-VPI-V_{th})^2)=k\Sigma(-W^2-2\ W\cdot(X+VRS+W_{base}-VPI)+2\ W\cdot V_{th})$.

Next, a difference (data B) between the data obtained when image capturing is not performed and the data obtained by supplying weights to the data is calculated. The difference is $k\Sigma((X+VRS+W_{base}-VPI-V_{th})^2-(W+VRS+W_{base}-VPI-V_{th})^2)=k\Sigma(-W^2-2\ W\cdot(VRS+W_{base}-VPI)+2\ W\cdot V_{th})$.

Then, a difference between the data A and the data B is calculated. The difference is $k\Sigma(-W^2-2\ W\cdot(X+VRS+W_{base}-VPI)+2\ W\cdot V_{th}-(-W^2-2\ W\cdot(VRS+W_{base}-VPI)+2\ W\cdot V_{th}))\ k\Sigma(-2\ W\cdot X)$. That is, offset components other than the product of the image data (X) and the weight coefficient (W) can be eliminated.

The circuit 201 can read out the data A and the data B. Note that the calculation of the difference between the data A and the data B can be performed by the circuit 301.

Figure 4:
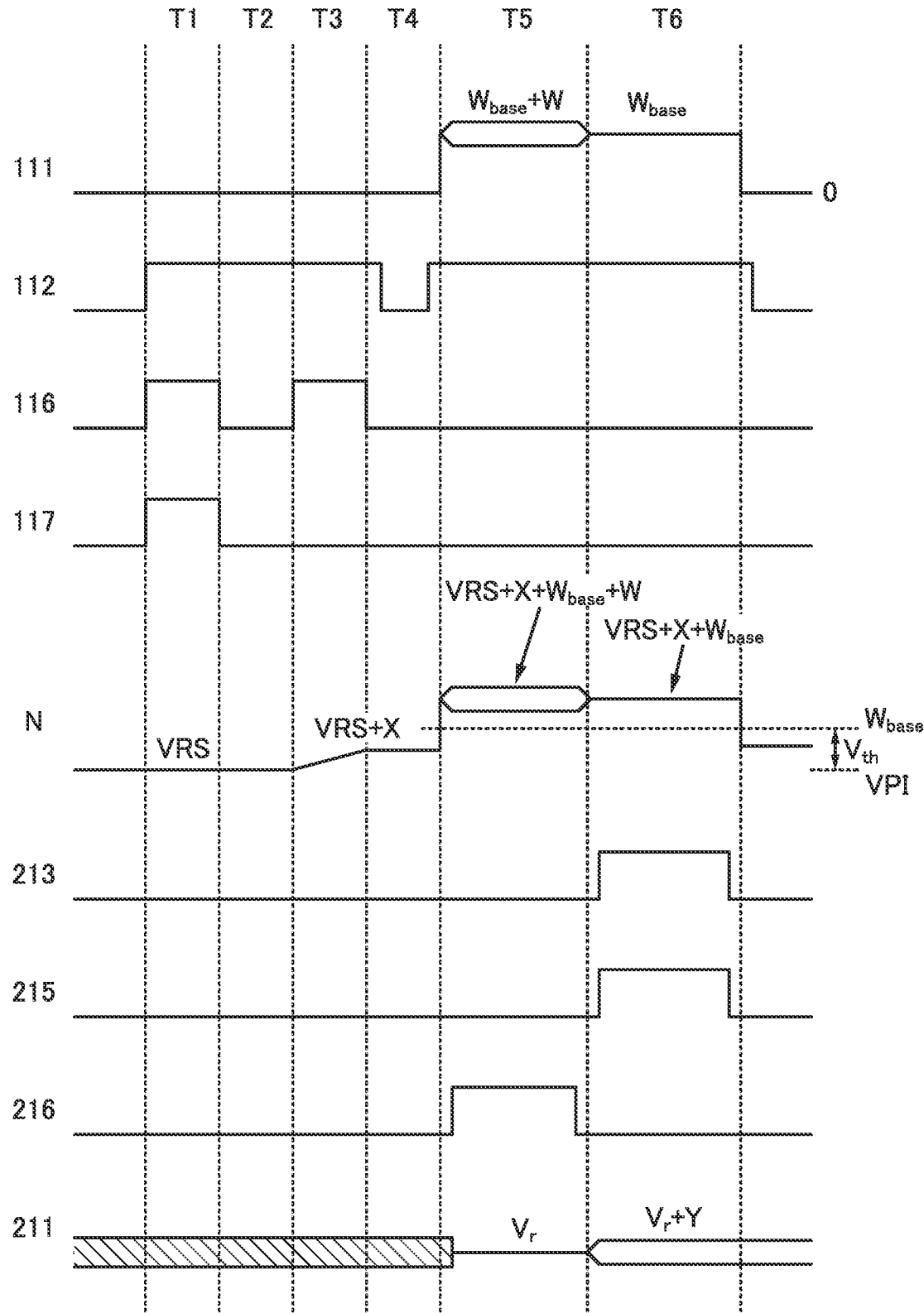
FIG. 4 is a timing chart showing operations of the pixel 100 and the circuit 201.

FIG. 4 is a timing chart illustrating an operation of calculating the difference (data A) between the data obtained when image capturing is performed and the data obtained by supplying weights to the data in the pixel block 200 and the circuit 201. For convenience, the timings of changing signals are matched in the chart; however, in reality, the timings are preferably shifted in consideration of the delay inside the circuit. Although the pixel block 200 includes the plurality of pixels 100, an operation of one pixel 100 is described here.

First, in a period T1, the potential of the wiring 117 is set to "H" and the potential of the wiring 116 is set to "H", so that the node N and the anode of the photoelectric conversion device 101 in the pixel 100 have the reset potential (VRS). Furthermore, the potential of the wiring 111 is set to "L" and the wiring 112 is set to "H", so that "L" (corresponding to a weight coefficient 0) is written to the other electrode of the capacitor 104.

In a period T2, the potential of the wiring 117 is set to "L" and the potential of the wiring 116 is set to "L", so that the reset potential (VRS) is retained in the node N.

In a period T3, the potential of the wiring 116 is set to "H" and the potential of the wiring 117 is set to "L", so that the potential X (image data) is written to the node N by photoelectric conversion in the photoelectric conversion device 101.

In a period T4, the potential of the wiring 112 is set to "L", so that "L" (corresponding to a weight coefficient 0) is retained in the other electrode of the capacitor 104. Furthermore, "VRS+X" is retained in the node N.

In a period T5, "$W_{base}+W$" is supplied to the wiring 111. "$W_{base}+W$" is a potential obtained by adding "$W_{base}$" for turning on the transistor 105 and the potential "W" corresponding to an arbitrary weight coefficient. When the potential of the wiring 112 is set to "H", the transistor 106 is turned on and the potential of the other electrode of the capacitor 104 becomes "$W_{base}+W$". In addition, the potential of the node N becomes "$VRS+X+W_{base}+W$" owing to capacitive coupling of the capacitor 104.

At this time, a current corresponding to the potential "$VRS+X+W_{base}+W$" at the node N flows through the transistor 105. Furthermore, in the circuit 201, the wiring 216 is set to "H", so that a potential Vr of the wiring 218 is written to the wiring 211. The operation in the period T5 corresponds to generation of the data obtained by supplying the weight to the data obtained when image capturing is performed, and the data is represented by the potential Vr of the wiring 211.

In a period T6, the potential of the wiring 111 is set to "$W_{base}$" and the potential of the wiring 112 is set to "H", so that the potential of the other electrode of the capacitor 104 becomes "$W_{base}$". In addition, the potential of the node N becomes "$VRS+X+W_{base}$" owing to capacitive coupling of the capacitor 104. The operation in the period T6 corresponds to generation of the data obtained when image capturing is performed.

At this time, a current corresponding to the potential "$VRS+X+W_{base}$" at the node N flows through the transistor 105. Here, the potential of the other electrode of the capacitor 202 in the circuit 201 changes in accordance with the current flowing through the wiring 113, and an amount Y of change is added to the potential Vr of the wiring 211 by capacitive coupling. Accordingly, the potential of the wiring 211 becomes "Vr+Y". Here, given that Vr=0, Y is the difference itself, which means that the data A is calculated.

Furthermore, the wiring 213 and the wiring 215 are set to "H", so that the circuit 201 can output a signal potential corresponding to the data A of the pixel 100 by a source follower operation.

Figure 5:
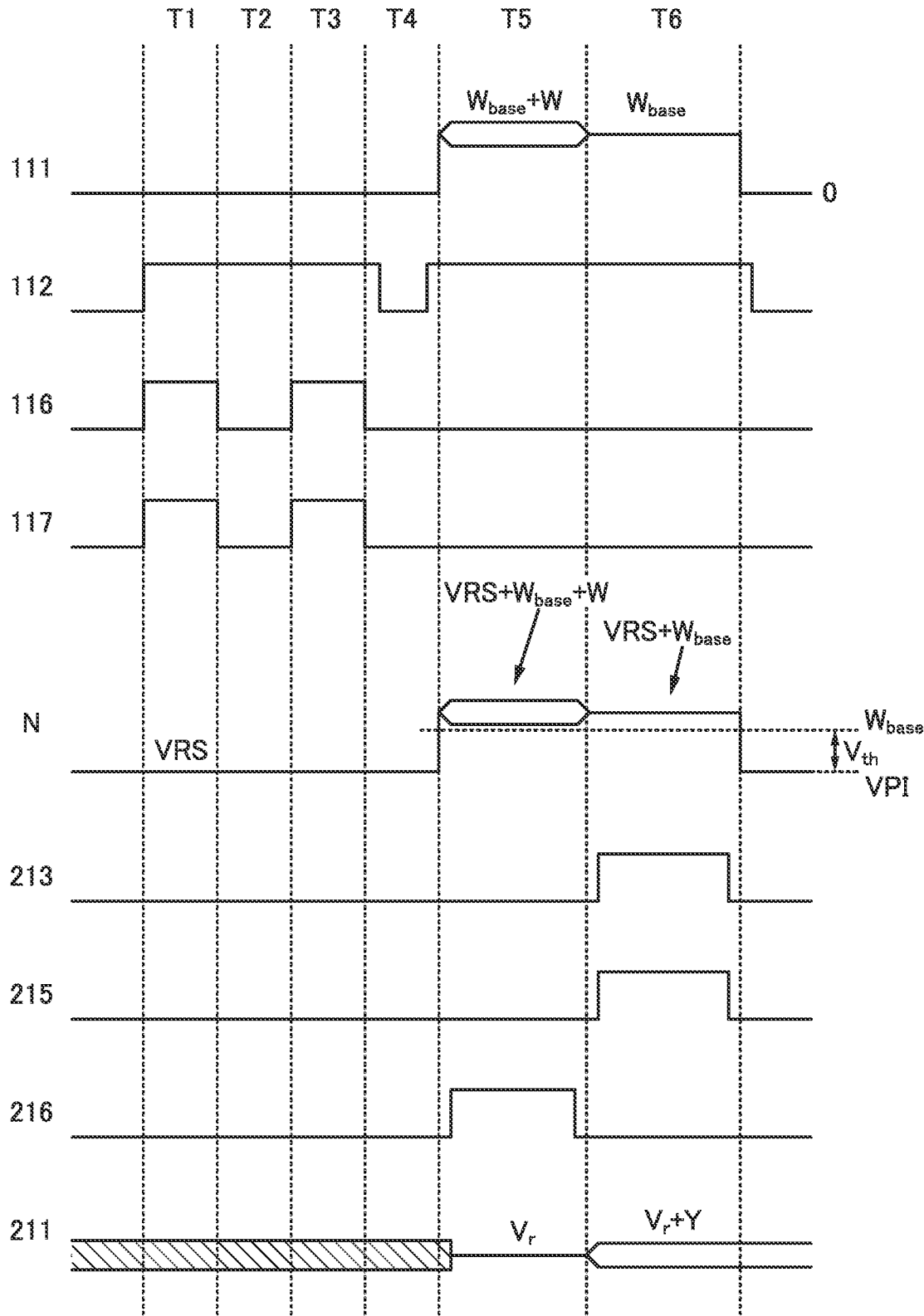
FIG. 5 is a timing chart showing operations of the pixel 100 and the circuit 201.

FIG. 5 is a timing chart illustrating an operation of calculating the difference (data B) between the data obtained when image capturing is not performed and the data obtained by supplying the weight to the data in the pixel 100 and the circuit 201.

First, in a period T1, the potential of the wiring 117 is set to "H" and the potential of the wiring 116 is set to "H", so that the node N and the anode of the photoelectric conversion device 101 in the pixel 100 have the reset potential (VRS). Furthermore, the potential of the wiring 111 is set to "L" and the wiring 112 is set to "H", so that "L" (corresponding to a weight coefficient 0) is written to the other electrode of the capacitor 104.

In a period T2, the potential of the wiring 117 is set to "L" and the potential of the wiring 116 is set to "L", so that the reset potential (VRS) is retained in the node N.

In a period T3, the potential of the wiring 116 is set to "H" and the potential of the wiring 117 is set to "H". In the period, the potential of the node N is the reset potential (VRS) regardless of the operation of the photoelectric conversion device 101.

In a period T4, the potential of the wiring 112 is set to "L", so that "L" (corresponding to a weight coefficient 0) is retained in the other electrode of the capacitor 104. Furthermore, "VRS" is retained in the node N.

In a period T5, "$W_{base}$+W" is supplied to the wiring 111. "$W_{base}$+W" is a potential obtained by adding "$W_{base}$" for turning on the transistor 105 and the potential "W" corresponding to an arbitrary weight coefficient. When the potential of the wiring 112 is set to "H", the transistor 106 is turned on and the potential of the other electrode of the capacitor 104 becomes "$W_{base}$+W". In addition, the potential of the node N becomes "VRS+$W_{base}$+W" owing to capacitive coupling of the capacitor 104.

At this time, a current corresponding to the potential "VRS+$W_{base}$+W" at the node N flows through the transistor 105. Furthermore, in the circuit 201, the wiring 216 is set to "H", so that a potential Vr of the wiring 218 is written to the wiring 211. The operation in the period T5 corresponds to generation of the data obtained by supplying the weight to the data obtained when image capturing is not performed, and the data is represented by the potential Vr of the wiring 211.

In a period T6, the potential of the wiring 111 is set to "$W_{base}$" and the potential of the wiring 112 is set to "H", so that the potential of the other electrode of the capacitor 104 becomes "$W_{base}$". In addition, the potential of the node N becomes "VRS+$W_{base}$" owing to capacitive coupling of the capacitor 104. The operation in the period T6 corresponds to generation of the data obtained when image capturing is not performed.

At this time, a current corresponding to the potential "VRS+$W_{base}$" at the node N flows through the transistor 105. Here, the potential of the other electrode of the capacitor 202 in the circuit 201 changes in accordance with the current flowing through the wiring 113, and an amount Y of change is added to the potential Vr of the wiring 211 by capacitive coupling. Accordingly, the potential of the wiring 211 becomes "Vr+Y". Here, given that Vr=0, Y is the difference itself, which means that the data B is calculated.

Furthermore, the wiring 213 and the wiring 215 are set to "H", so that the circuit 201 can output a signal potential corresponding to the data B of the pixel 100 by a source follower operation.

The data A and the data B output from the circuit 201 in the above operations are input to the circuit 301. Calculation of the difference between the data A and the data B is performed in the circuit 301, so that unnecessary offset components other than the product of the image data (potential X) and the weight coefficient (potential W) can be eliminated. The circuit 301 may have a structure in which the difference is calculated by utilizing a memory circuit and software processing, other than the structure including an arithmetic circuit such as the circuit 201.

Figure 6:
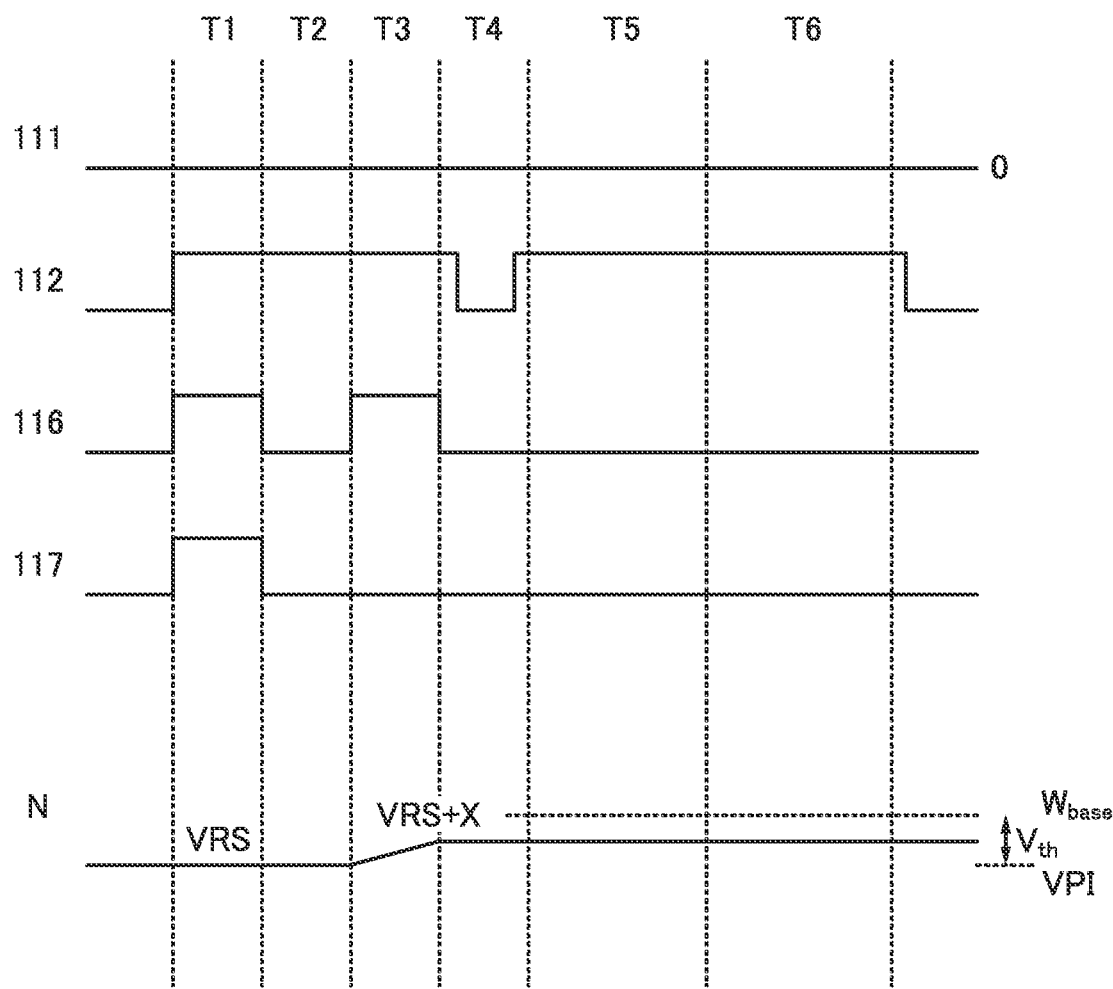
FIG. 6 is a timing chart showing an operation of the pixel 100.

An arbitrary pixel 100 can be targeted for the above-described operations. In the pixel 100 which is not targeted for reading, the potential that the wiring 111 supplies is set to "L" so that a potential for turning on the transistor 105 is not supplied, as illustrated in the timing chart of FIG. 6.

Note that also in the pixel 100 which is not targeted for reading, an accumulation operation is performed in a manner similar to that of the accumulation operation in the pixel 100 which is targeted for reading. Thus, an image-capturing operation is performed in all the pixels 100, and captured image data can be read from all the pixels 100 by supplying "$W_{base}$" from the wiring 111 and turning on the transistor 105. In other words, the imaging device of one embodiment of the present invention can also perform a normal image-capturing operation.

In the imaging device of one embodiment of the present invention, selection of the pixel 100 is performed with a row selection signal, which is supplied to the wiring 112, and "$W_{base}$", which is supplied from the wiring 111. Thus, an arbitrary pixel block 200 can be selected from all the pixel blocks 200 and reading can be performed. In the pixels 100 included in the pixel blocks 200 other than the selected pixel block 200, the transistor 105 is in an off state and unwanted power consumption can be reduced.

Figure 7A:
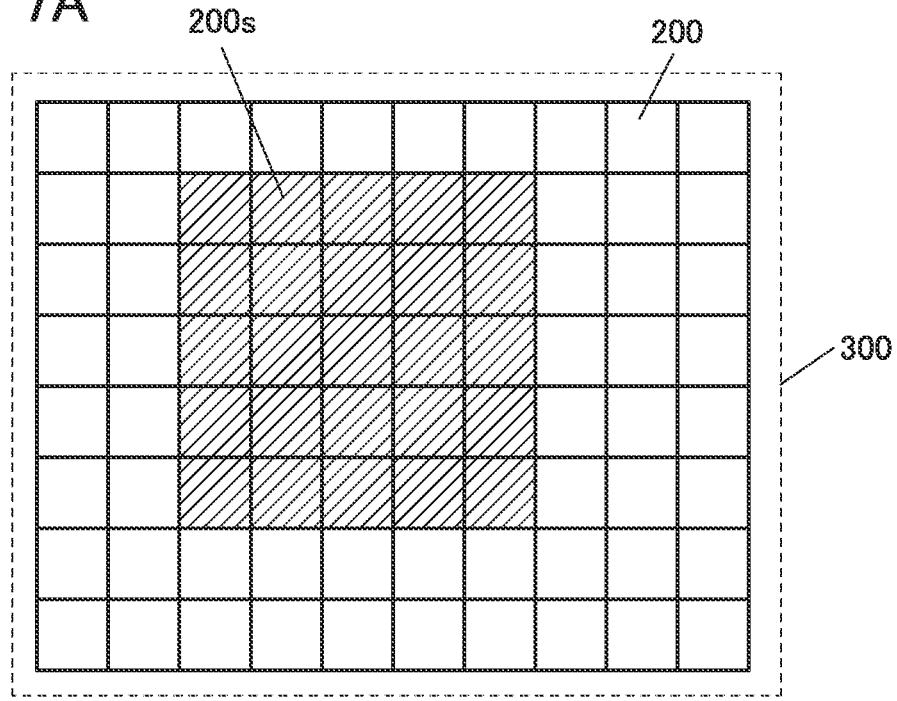
FIG. 7A and FIG. 7B are diagrams illustrating operations of selecting arbitrary pixel blocks 200 and performing reading.
Figure 7B:
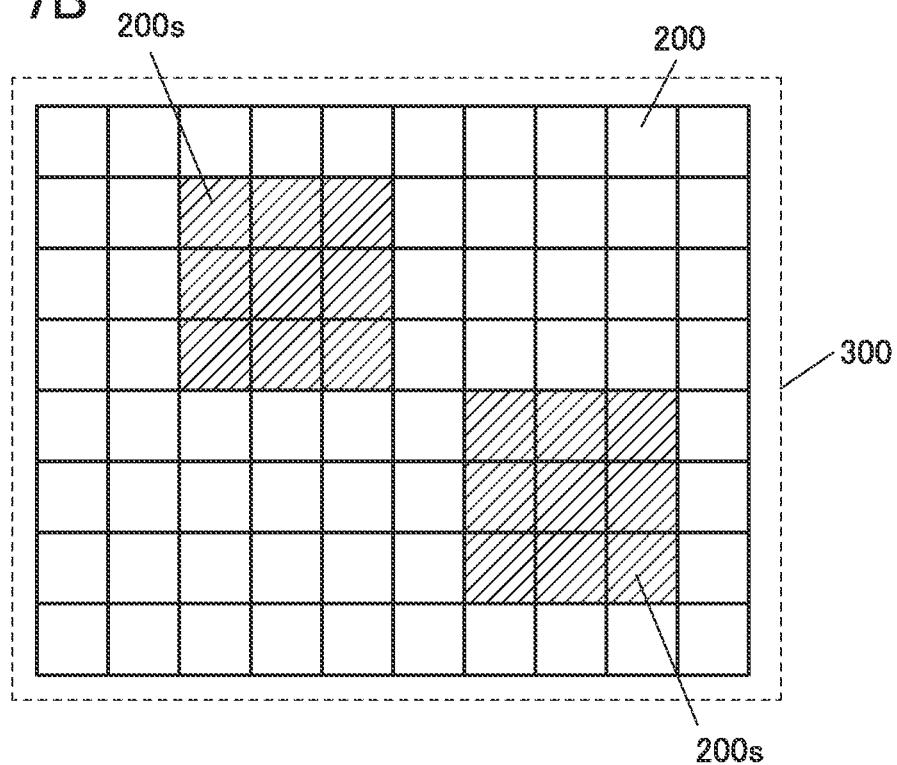

For example, as illustrated in FIG. 7A, a plurality of pixel blocks 200 (illustrated as a pixel block 200s) in a region in the pixel array 300 can be selectively read. Alternatively, as illustrated in FIG. 7B, a plurality of pixel blocks 200 (illustrated as pixel blocks 200s) in two different regions in the pixel array 300 can be selectively read. Note that the number of regions that can be selectively read may be increased more. This is effective when part of the obtained image is targeted like a bird or airplane flying in the clear sky, for example.

Figure 8A:
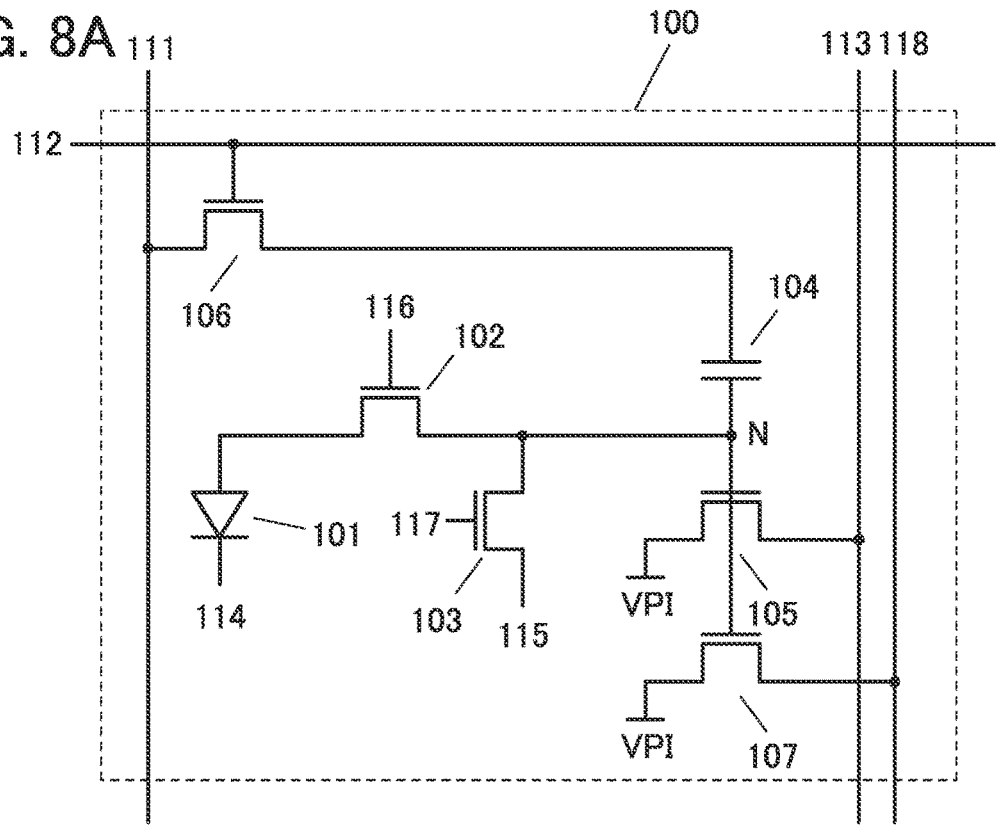
FIG. 8A is a diagram illustrating the pixel 100.

Note that the adjacent pixel blocks 200 may share the pixel 100. For example, a transistor 107 capable of producing output in a manner similar to that of the transistor 105 is provided in the pixel 100 as illustrated in FIG. 8A. A gate of the transistor 107 is electrically connected to the gate of the transistor 105, and one of a source and a drain of the transistor 107 is electrically connected to a wiring 118.

Figure 8B:
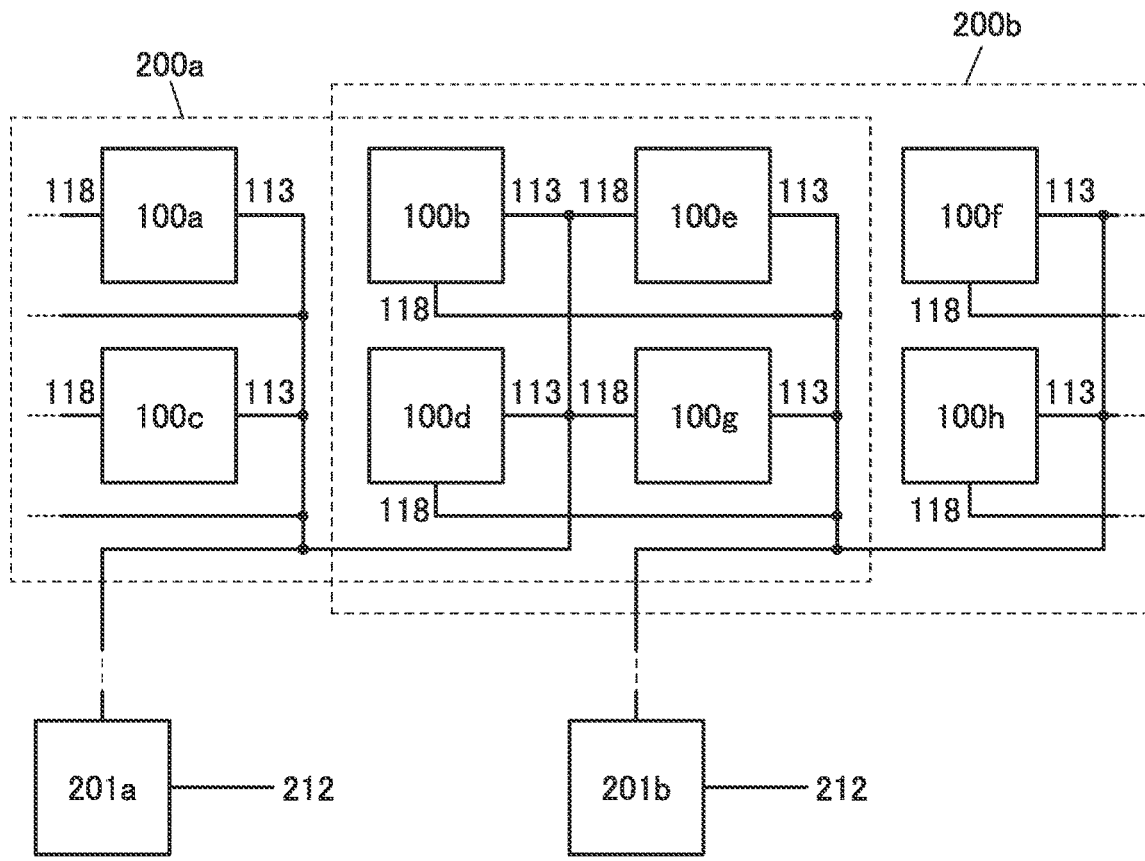
FIG. 8B is a diagram illustrating a connection relation between pixels 100 and circuits 201.

The wiring 118 is utilized for electrical connection to the circuit 201 connected to the adjacent pixel blocks. FIG. 8B illustrates a form of connection between the pixels 100 (pixels 100a, 100b, 100c, 100d, 100e, 100f, 100g, and 100h) in the adjacent pixel blocks 200 (pixel blocks 200a and 200b) and the circuits 201 (circuits 201a and 201b) connected to the pixel blocks 200.

In the pixel block 200a, the pixels 100a, 100b, 100c, and 100d are electrically connected to the circuit 201a through the wiring 113. Furthermore, the pixels 100e and 100g are electrically connected to the circuit 201a through the wiring 118.

In the pixel block 200b, the pixels 100e, 100f, 100g, and 100h are electrically connected to the circuit 201b through the wiring 113. Furthermore, the pixels 100b and 100d are electrically connected to the circuit 201b through the wiring 118.

That is, it can be said that the pixel block 200a and the pixel block 200b share the pixels 100b, 100d, 100e, and 100g. With this form, a network between the pixel blocks 200 can be dense, improving the accuracy of image analysis and the like.

The weight coefficient can be output from the circuit 304 illustrated in FIG. 1 to the wiring 111, and it is preferable to rewrite the weight coefficient more than once in a frame period. As the circuit 304, a decoder or a shift register can be used. The circuit 304 may include a D/A converter or an SRAM.

A signal can be output from the circuit 303 to the wiring 112 for selecting the pixel 100 to which the weight coefficient is input. As the circuit 303, a decoder or a shift register can be used.

Figure 9A:
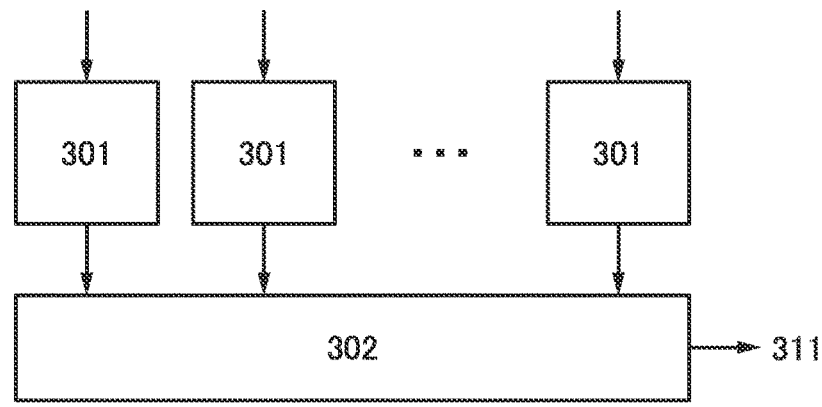
FIG. 9A and FIG. 9B are diagrams illustrating circuits 301 and a circuit 302.

FIG. 9A is a diagram illustrating the circuit 302 and the circuits 301 connected to the circuit 201. Product-sum operation result data output from the circuit 201 are sequentially input to the circuits 301. The circuits 301 may each have a variety of arithmetic functions in addition to the above-described function of calculating the difference between the data A and the data B. For example, the circuits 301 can have a structure similar to that of the circuit 201. Alternatively, the function of the circuits 301 may be replaced by software processing.

The circuits 301 may each include a circuit that performs an arithmetic operation of an activation function. A comparator circuit can be used as the circuit, for example. A comparator circuit outputs a result of comparing input data and a set threshold as binary data. In other words, the pixel blocks 200 and the circuits 301 can operate as part of elements in a neural network.

Furthermore, in the case where the data output from the pixel blocks 200, which corresponds to image data of a plurality of bits, can be binarized by the circuits 301, the binarization can be rephrased as compression of image data.

Data output from the circuits 301 are sequentially input to the circuit 302. The circuit 302 can have a structure including a latch circuit, a shift register, and the like, for example. With this structure, parallel-serial conversion can be performed and data input in parallel can be output to the wiring 311 as serial data. The connection destination of the wiring 311 is not limited. For example, it can be connected to a neural network, a memory device, a communication device, or the like.

Figure 9B:
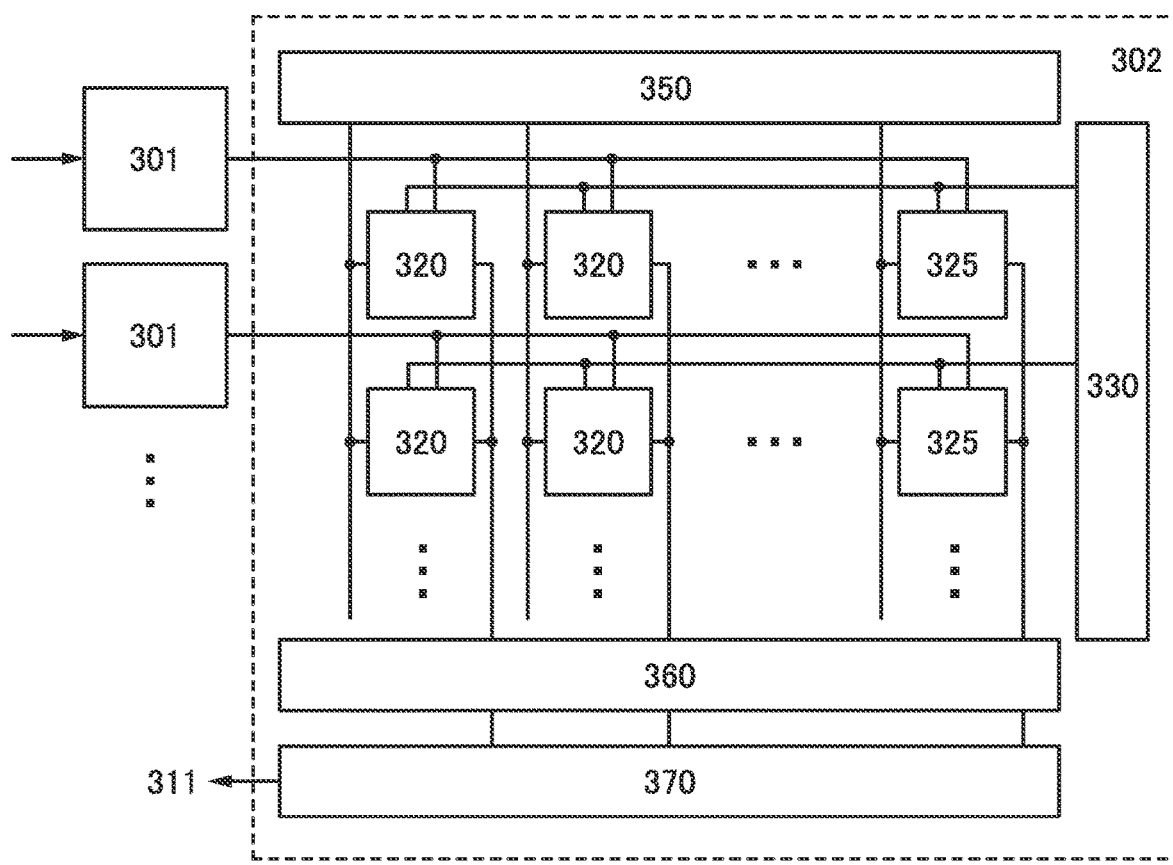

Moreover, as illustrated in FIG. 9B, the circuit 302 may include a neural network. The neural network includes memory cells arranged in a matrix, and each memory cell retains a weight coefficient. Data output from the circuits 301 are input to corresponding memory cells 320, and a product-sum operation can be performed. Note that the number of memory cells illustrated in FIG. 9B is an example, and the number is not limited.

The neural network illustrated in FIG. 9B includes the memory cells 320 and reference memory cells 325 which are arranged in a matrix, a circuit 330, a circuit 350, a circuit 360, and a circuit 370.

Figure 10:
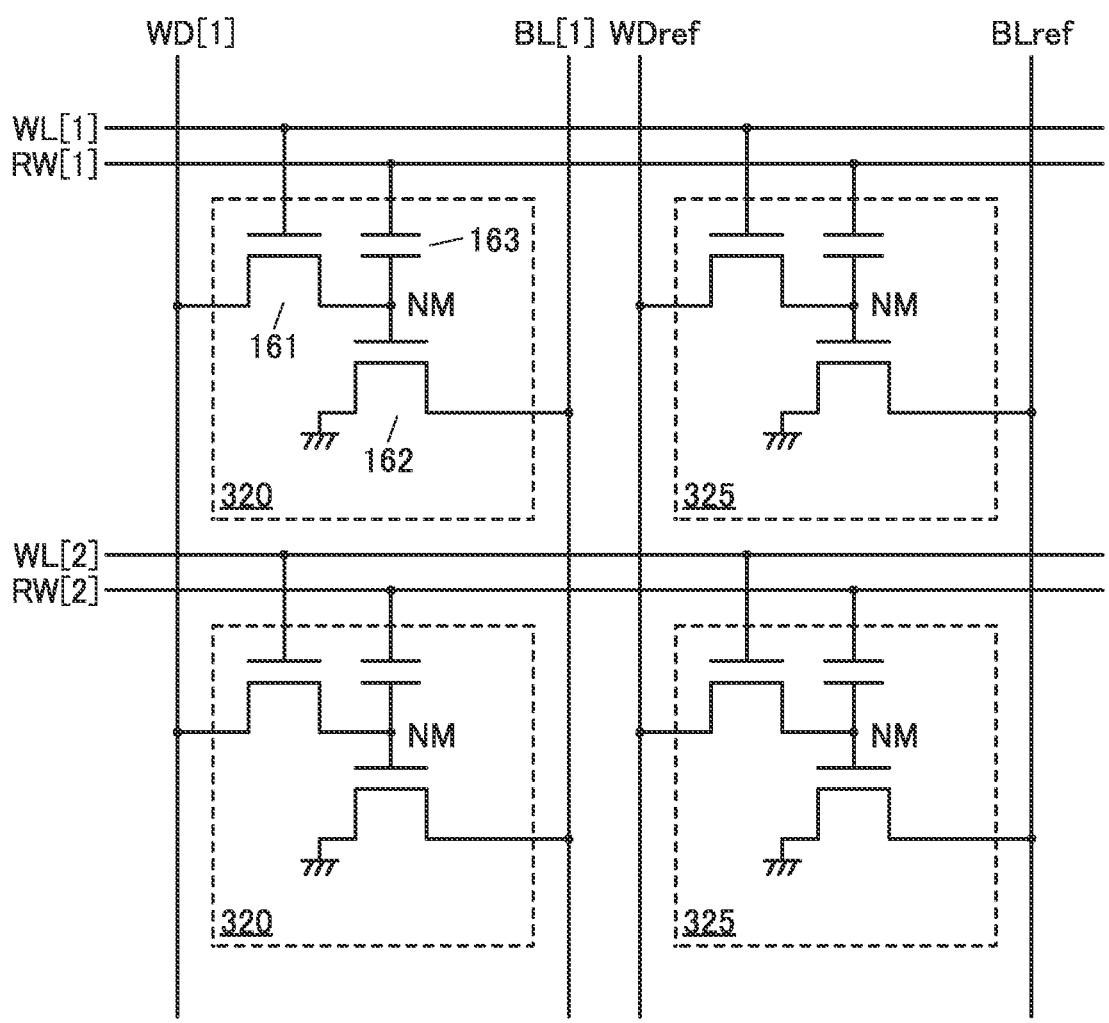
FIG. 10 is a diagram illustrating memory cells.

FIG. 10 illustrates an example of the memory cells 320 and the reference memory cells 325. The reference memory cells 325 are provided in an arbitrary one column. The memory cells 320 and the reference memory cells 325 have similar structures and each include a transistor 161, a transistor 162, and a capacitor 163.

One of a source and a drain of the transistor 161 is electrically connected to a gate of the transistor 162. The gate of the transistor 162 is electrically connected to one electrode of the capacitor 163. Here, a point where the one of the source and the drain of the transistor 161, the gate of the transistor 162, and the one electrode of the capacitor 163 are connected is referred to as a node NM.

A gate of the transistor 161 is electrically connected to a wiring WL. The other electrode of the capacitor 163 is electrically connected to a wiring RW. One of a source and a drain of the transistor 162 is electrically connected to a reference potential wiring such as a GND wiring.

In the memory cell 320, the other of the source and the drain of the transistor 161 is electrically connected to a wiring WD. The other of the source and the drain of the transistor 162 is electrically connected to a wiring BL.

In the reference memory cell 325, the other of the source and the drain of the transistor 161 is electrically connected to a wiring WDref. The other of the source and the drain of the transistor 162 is electrically connected to a wiring BLref.

The wiring WL is electrically connected to the circuit 330. As the circuit 330, a decoder, a shift register, or the like can be used.

The wiring RW is electrically connected to the circuit 301. Binary data output from the circuit 301 is written to each memory cell. Note that a sequential circuit such as a shift register may be included between the circuit 301 and the memory cells.

The wiring WD and the wiring WDref are electrically connected to the circuit 350. As the circuit 350, a decoder, a shift register, or the like can be used. The circuit 350 may include a D/A converter or an SRAM. The circuit 350 can output a weight coefficient to be written to the node NM.

The wiring BL and the wiring BLref are electrically connected to the circuit 360. The circuit 360 can have a structure equivalent to that of the circuit 201. By the circuit 360, a signal of a product-sum operation result from which offset components are eliminated can be obtained.

The circuit 360 is electrically connected to the circuit 370. The circuit 370 can also be referred to as an activation function circuit. The activation function circuit has a function of performing an arithmetic operation for converting the signal input from the circuit 360 in accordance with a predefined activation function. As the activation function, for example, a sigmoid function, a tan h function, a softmax function, a ReLU function, a threshold function, or the like can be used. The signal converted by the activation function circuit is output to the outside as output data.

Figure 11A:
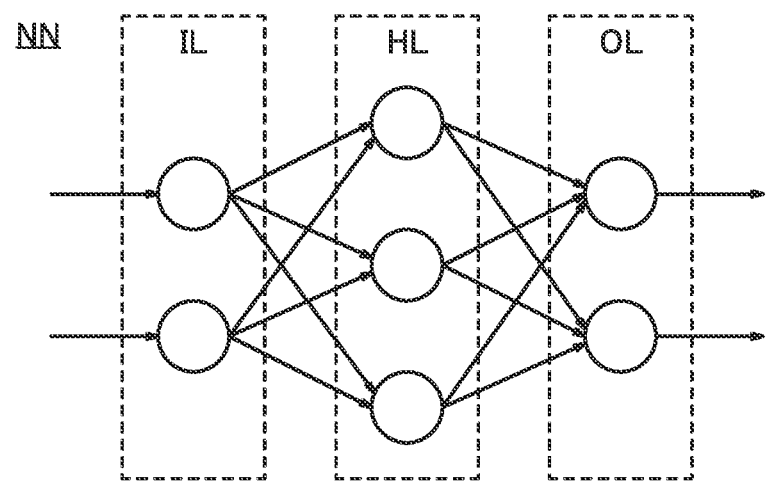
FIG. 11A and FIG. 11B are diagrams illustrating a structure example of a neural network.

As illustrated in FIG. 11A, a neural network NN can be formed of an input layer IL, an output layer OL, and a middle layer (hidden layer) HL. The input layer IL, the output layer OL, and the middle layer HL each include one or more neurons (units). Note that the middle layer HL may be composed of one layer or two or more layers. A neural network including two or more middle layers HL can also be referred to as a DNN (deep neural network). Learning using a deep neural network can also be referred to as deep learning.

Input data is input to each neuron in the input layer IL. A signal output from a neuron in the previous layer or the subsequent layer is input to each neuron in the middle layer HL. To each neuron in the output layer OL, output signals of the neurons in the previous layer are input. Note that each neuron may be connected to all the neurons in the previous and subsequent layers (full connection), or may be connected to some of the neurons.

Figure 11B:
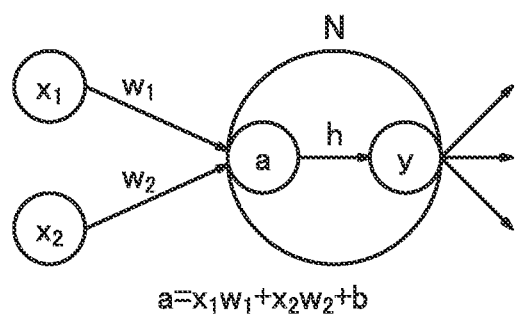

FIG. 11B illustrates an example of an arithmetic operation with the neurons. Here, a neuron N and two neurons in the previous layer which output signals to the neuron N are illustrated. An output $x_1$ of a neuron in the previous layer and an output $x_2$ of a neuron in the previous layer are input to the neuron N. Then, in the neuron N, a total sum $x_1w_1+x_2w_2$ of a multiplication result ($x_1w_1$) of the output $x_1$ and a weight $w_1$ and a multiplication result ($x_2w_2$) of the output $x_2$ and a weight $w_2$ is calculated, and then a bias b is added as necessary, so that the value $a=x_1w_1+x_2w_2+b$ is obtained. Then, the value a is converted with an activation function h, and an output signal y=ah is output from the neuron N.

In this manner, the arithmetic operation with the neurons includes the arithmetic operation that sums the products of the outputs and the weights of the neurons in the previous layer, that is, the product-sum operation ($x_1w_1+x_2w_2$ described above). This product-sum operation may be performed using a program on software or may be performed using hardware.

In one embodiment of the present invention, an analog circuit is used as hardware to perform a product-sum operation. In the case where an analog circuit is used as the product-sum operation circuit, the circuit scale of the product-sum operation circuit can be reduced, or higher processing speed and lower power consumption can be achieved by reduced frequency of access to a memory.

The product-sum operation circuit preferably has a structure including an OS transistor. An OS transistor is suitably used as a transistor included in an analog memory of the product-sum operation circuit because of its extremely low off-state current. Note that the product-sum operation circuit may be formed using both a Si transistor and an OS transistor.

This embodiment can be combined with any of the other embodiments as appropriate.

Embodiment 2

In this embodiment, structure examples and the like of the imaging device of one embodiment of the present invention are described.

Figure 12A:
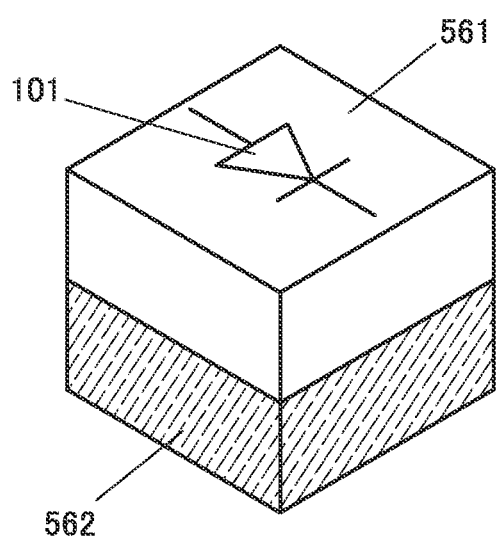
FIG. 12A to FIG. 12E are diagrams illustrating structures of a pixel of an imaging device.
Figure 12B:
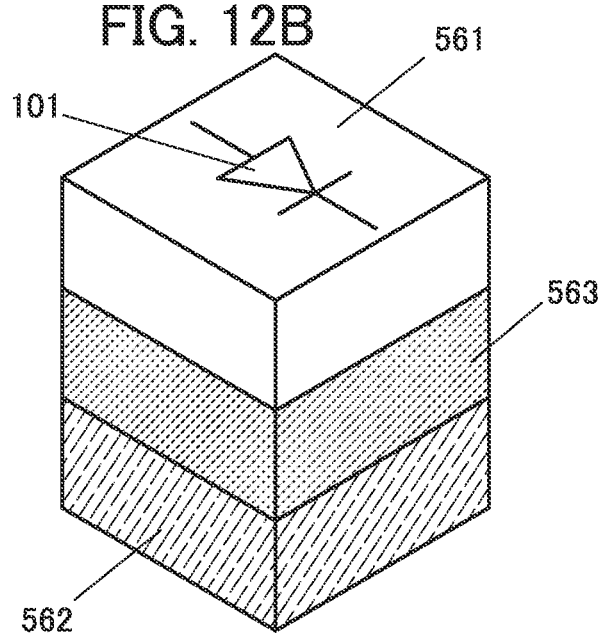

FIG. 12A and FIG. 12B illustrate examples of a structure of a pixel included in the imaging device. The pixel illustrated in FIG. 12A has a stacked-layer structure of a layer 561 and a layer 562, for example.

The layer 561 includes the photoelectric conversion device 101. The photoelectric conversion device 101 can have a stacked-layer structure of a layer 565a, a layer 565b, and a layer 565c as illustrated in FIG. 12C.

Figure 12C:
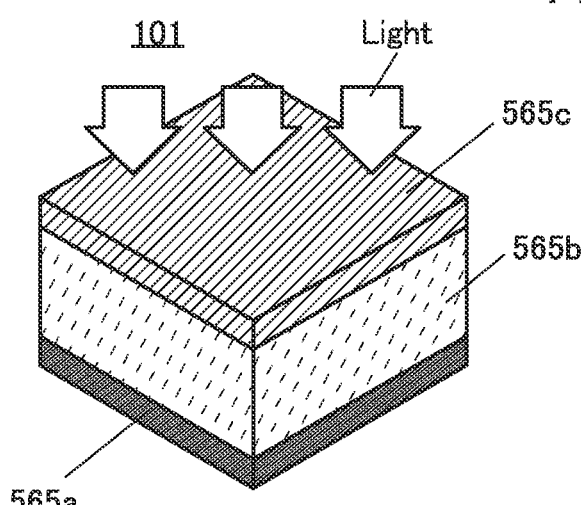

The photoelectric conversion device 101 illustrated in FIG. 12C is a pn-junction photodiode; for example, a p$^+$-type semiconductor can be used for the layer 565a, an n-type semiconductor can be used for the layer 565b, and an n$^+$-type semiconductor can be used for the layer 565c. Alternatively, an n$^+$-type semiconductor may be used for the layer 565a, a p-type semiconductor may be used for the layer 565b, and a p$^+$-type semiconductor may be used for the layer 565c. Alternatively, a pin-junction photodiode in which the layer 565b is an i-type semiconductor may be used.

The pn-junction photodiode or the pin-junction photodiode can be formed using single crystal silicon. The pin-junction photodiode can also be formed using a thin film of amorphous silicon, microcrystalline silicon, polycrystalline silicon, or the like.

Figure 12D:
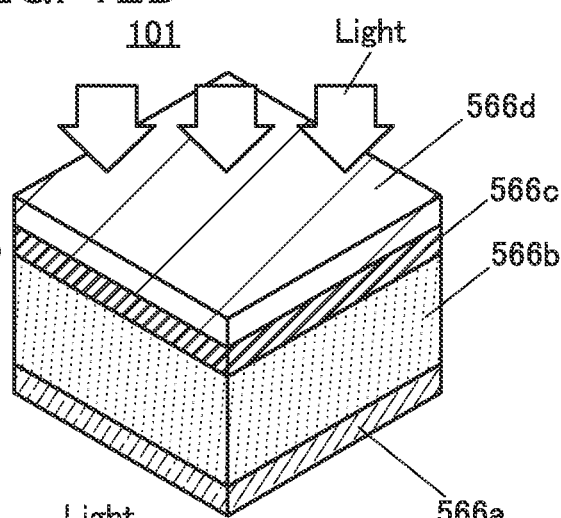

The photoelectric conversion device 101 included in the layer 561 may have a stacked-layer structure of a layer 566a, a layer 566b, a layer 566c, and a layer 566d as illustrated in FIG. 12D. The photoelectric conversion device 101 illustrated in FIG. 12D is an example of an avalanche photodiode, and the layer 566a and the layer 566d correspond to electrodes and the layers 566b and 566c correspond to a photoelectric conversion portion.

The layer 566a is preferably a low-resistance metal layer or the like. For example, aluminum, titanium, tungsten, tantalum, silver, or a stacked layer thereof can be used.

A conductive layer having a high light-transmitting property with respect to visible light (Light) is preferably used as the layer 566d. For example, indium oxide, tin oxide, zinc oxide, indium tin oxide, gallium zinc oxide, indium gallium zinc oxide, graphene, or the like can be used. Note that a structure in which the layer 566d is omitted can also be employed.

A structure of a pn-junction photodiode containing a selenium-based material in a photoelectric conversion layer can be used for the layers 566b and 566c of the photoelectric conversion portion, for example. A selenium-based material, which is a p-type semiconductor, is preferably used for the layer 566b, and gallium oxide or the like, which is an n-type semiconductor, is preferably used for the layer 566c.

A photoelectric conversion device containing a selenium-based material has characteristics of high external quantum efficiency with respect to visible light. In the photoelectric conversion device, electrons are greatly amplified with respect to the amount of incident light (Light) by utilizing the avalanche multiplication. A selenium-based material has a high light-absorption coefficient and thus has advantages in production; for example, a photoelectric conversion layer can be formed using a thin film. A thin film of a selenium-based material can be formed by a vacuum evaporation method, a sputtering method, or the like.

As a selenium-based material, crystalline selenium such as single crystal selenium or polycrystalline selenium, amorphous selenium, a compound of copper, indium, and selenium (CIS), a compound of copper, indium, gallium, and selenium (CIGS), or the like can be used.

An n-type semiconductor is preferably formed using a material with a wide band gap and a light-transmitting property with respect to visible light. For example, zinc oxide, gallium oxide, indium oxide, tin oxide, or mixed oxide thereof can be used. In addition, these materials have a function of a hole-injection blocking layer, so that a dark current can be decreased.

Figure 12E:
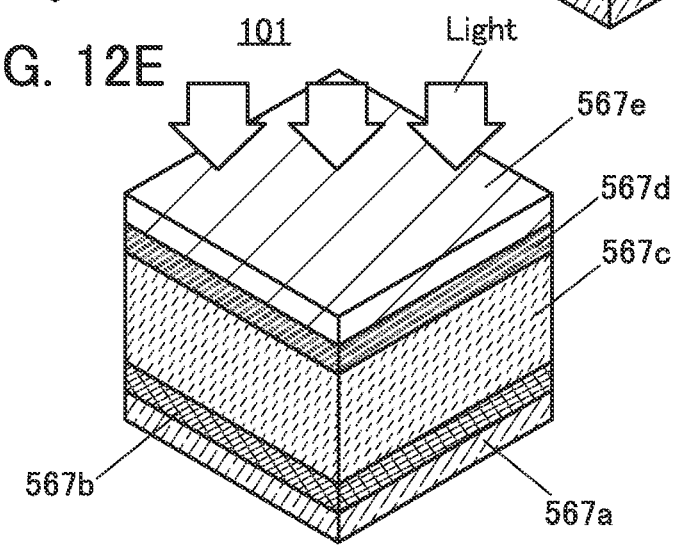

The photoelectric conversion device 101 included in the layer 561 may have a stacked-layer structure of a layer 567a, a layer 567b, a layer 567c, a layer 567d, and a layer 567e as illustrated in FIG. 12E. The photoelectric conversion device 101 illustrated in FIG. 12E is an example of an organic optical conductive film, and the layer 567a and the layer 567e correspond to electrodes and the layers 567b, 567c, and 567d correspond to a photoelectric conversion portion.

One of the layers 567b and 567d in the photoelectric conversion portion can be a hole-transport layer and the other can be an electron-transport layer. The layer 567c can be a photoelectric conversion layer.

For the hole-transport layer, molybdenum oxide can be used, for example. For the electron-transport layer, fullerene such as C60 or C70, or a derivative thereof can be used, for example.

As the photoelectric conversion layer, a mixed layer of an n-type organic semiconductor and a p-type organic semiconductor (bulk heterojunction structure) can be used.

For the layer 562 illustrated in FIG. 12A, a silicon substrate can be used, for example. The silicon substrate includes a Si transistor or the like. With the use of the Si transistor, as well as a pixel circuit, a circuit for driving the pixel circuit, a circuit for reading out an image signal, an image processing circuit, a memory circuit, or the like can be provided. Specifically, some or all of the transistors included in the pixel circuits and the peripheral circuits (the pixels 100, the circuits 201, 301, 302, 303, and 304, and the like) described in Embodiment 1 can be provided in the layer 562.

Furthermore, the pixel may have a stacked-layer structure of the layer 561, a layer 563, and the layer 562 as illustrated in FIG. 12B.

The layer 563 can include an OS transistor. In that case, the layer 562 may include a Si transistor. Furthermore, some of the transistors included in the peripheral circuits described in Embodiment 1 may be provided in the layer 563.

With such a structure, components of the pixel circuit and the peripheral circuits can be distributed in a plurality of layers and the components can be provided to overlap with each other or any of the components and any of the peripheral circuits can be provided to overlap with each other, whereby the area of the imaging device can be reduced. Note that in the structure of FIG. 12B, the layer 562 may be a support substrate, and the pixels 100 and the peripheral circuits may be provided in the layer 561 and the layer 563.

As a semiconductor material used for an OS transistor, a metal oxide whose energy gap is greater than or equal to 2 eV, preferably greater than or equal to 2.5 eV, further preferably greater than or equal to 3 eV can be used. A typical example thereof is an oxide semiconductor containing indium, and a CAAC-OS (C-Axis Aligned Crystalline Oxide Semiconductor), a CAC-OS, each of which will be described later, or the like can be used, for example. A CAAC-OS has a crystal structure including stable atoms and is suitable for a transistor that is required to have high reliability, and the like. A CAC-OS has high mobility and is suitable for a transistor that operates at high speed, and the like.

In an OS transistor, a semiconductor layer has a large energy gap, and thus the OS transistor has an extremely low off-state current of several yoctoamperes per micrometer (current per micrometer of a channel width). An OS transistor has features such that impact ionization, an avalanche breakdown, a short-channel effect, or the like does not occur, which are different from those of a Si transistor. Thus, the use of an OS transistor enables formation of a circuit having high withstand voltage and high reliability. Moreover, variations in electrical characteristics due to crystallinity unevenness, which are caused in the Si transistor, are less likely to occur in OS transistors.

A semiconductor layer in an OS transistor can be, for example, a film represented by an In-M-Zn-based oxide that contains indium, zinc, and M (a metal such as aluminum, titanium, gallium, germanium, yttrium, zirconium, lanthanum, cerium, tin, neodymium, or hafnium). The In-M-Zn-based oxide can be typically formed by a sputtering method. Alternatively, the In-M-Zn-based oxide may be formed by an ALD (Atomic layer deposition) method.

It is preferable that the atomic ratio of metal elements of a sputtering target used for forming the In-M-Zn-based oxide by a sputtering method satisfy In≥M and Zn≥M. The atomic ratio of metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio in the formed semiconductor layer may vary from the above atomic ratio of metal elements in the sputtering target in a range of ±40%.

An oxide semiconductor with low carrier density is used for the semiconductor layer. For example, for the semiconductor layer, an oxide semiconductor whose carrier density is lower than or equal to $1 \times 10^{17}/cm^3$, preferably lower than or equal to $1 \times 10^{15}/cm^3$, further preferably lower than or equal to $1 \times 10^{13}/cm^3$, still further preferably lower than or equal to $1 \times 10^{11}/cm^3$, even further preferably lower than $1 \times 10^{10}/cm^3$, and higher than or equal to $1 \times 10^{-9}/cm^3$ can be used. Such an oxide semiconductor is referred to as a highly purified intrinsic or substantially highly purified intrinsic oxide semiconductor. The oxide semiconductor has a low density of defect states and can thus be referred to as an oxide semiconductor having stable characteristics.

Note that the composition is not limited to those described above, and a material having the appropriate composition may be used depending on required semiconductor characteristics and electrical characteristics of the transistor (e.g., field-effect mobility and threshold voltage). To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to appropriate values.

When silicon or carbon, which is one of elements belonging to Group 14, is contained in the oxide semiconductor contained in the semiconductor layer, oxygen vacancies are increased, and the semiconductor layer becomes n-type. Thus, the concentration of silicon or carbon (the concentration obtained by secondary ion mass spectrometry) in the semiconductor layer is set to lower than or equal to $2 \times 10^{18}$ atoms/cm$^3$, preferably lower than or equal to $2 \times 10^{17}$ atoms/cm$^3$.

Alkali metal and alkaline earth metal might generate carriers when bonded to an oxide semiconductor, in which case the off-state current of the transistor might be increased. Therefore, the concentration of alkali metal or alkaline earth metal in the semiconductor layer (the concentration obtained by secondary ion mass spectrometry) is set to lower than or equal to $1 \times 10^{18}$ atoms/cm$^3$, preferably lower than or equal to $2 \times 10^{16}$ atoms/cm$^3$.

When nitrogen is contained in the oxide semiconductor contained in the semiconductor layer, electrons serving as carriers are generated and the carrier density increases, so that the semiconductor layer easily becomes n-type. As a result, a transistor using an oxide semiconductor that contains nitrogen is likely to have normally-on characteristics. Hence, the nitrogen concentration (the concentration obtained by secondary ion mass spectrometry) in the semiconductor layer is preferably set to lower than or equal to $5 \times 10^{18}$ atoms/cm$^3$.

When hydrogen is contained in the oxide semiconductor contained in the semiconductor layer, hydrogen reacts with oxygen bonded to a metal atom to be water, and thus sometimes forms oxygen vacancies in the oxide semiconductor. When the channel formation region in the oxide semiconductor includes oxygen vacancies, the transistor sometimes has normally-on characteristics. In some cases, a defect in which hydrogen enters oxygen vacancies functions as a donor and generates electrons serving as carriers. In other cases, bonding of part of hydrogen to oxygen bonded to a metal atom generates electrons serving as carriers. Thus, a transistor using an oxide semiconductor that contains a large amount of hydrogen is likely to have normally-on characteristics.

A defect in which hydrogen enters oxygen vacancies can function as a donor of the oxide semiconductor. However, it is difficult to evaluate the defects quantitatively. Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" in this specification and the like can be replaced with "donor concentration" in some cases.

Therefore, hydrogen in the oxide semiconductor is preferably reduced as much as possible. Specifically, the hydrogen concentration of the oxide semiconductor, which is obtained by secondary ion mass spectrometry (SIMS), is lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$. When an oxide semiconductor with sufficiently reduced impurities such as hydrogen is used for a channel formation region of a transistor, stable electrical characteristics can be given.

The semiconductor layer may have a non-single-crystal structure, for example. Examples of the non-single-crystal structure include CAAC-OS including a c-axis aligned crystal, a polycrystalline structure, a microcrystalline structure, and an amorphous structure. Among the non-single-crystal structures, the amorphous structure has the highest density of defect states, whereas the CAAC-OS has the lowest density of defect states.

An oxide semiconductor film having an amorphous structure has disordered atomic arrangement and no crystalline component, for example. Alternatively, an oxide semiconductor film having an amorphous structure has, for example, a completely amorphous structure and no crystal part.

Note that the semiconductor layer may be a mixed film including two or more of a region having an amorphous structure, a region having a microcrystalline structure, a region having a polycrystalline structure, a CAAC-OS region, and a region having a single crystal structure. The mixed film has, for example, a single-layer structure or a stacked-layer structure including two or more of the above regions in some cases.

The composition of a CAC (Cloud-Aligned Composite)-OS, which is one embodiment of a non-single-crystal semiconductor layer, will be described below.

A CAC-OS refers to one composition of a material in which elements constituting an oxide semiconductor are unevenly distributed with a size greater than or equal to 0.5 nm and less than or equal to 10 nm, preferably greater than or equal to 1 nm and less than or equal to 2 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 2 nm, or a similar size in an oxide semiconductor is hereinafter referred to as a mosaic pattern or a patch-like pattern.

Note that an oxide semiconductor preferably contains at least indium. It is particularly preferable that indium and zinc be contained. Moreover, in addition to these, one kind or a plurality of kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0) or gallium zinc oxide ($Ga_{X4}Zn_{Y4}O_{Z4}$, where X4, Y4, and Z4 are real numbers greater than 0), and a mosaic pattern is formed. Then, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite oxide semiconductor having a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is larger than the atomic ratio of In to the element M in a second region, the first region is regarded as having a higher In concentration than the second region.

Note that IGZO is a commonly known name and sometimes refers to one compound formed of In, Ga, Zn, and O. A typical example is a crystalline compound represented by $InGaO_3(ZnO)_{m1}$ (m1 is a natural number) or $In_{(1+x0)}Ga_{(1-x0)}O_3(ZnO)_{m0}$ ($-1 \leq x0 \leq 1$; m0 is a given number).

The above crystalline compound has a single crystal structure, a polycrystalline structure, or a CAAC structure. Note that the CAAC structure is a crystal structure in which a plurality of IGZO nanocrystals have c-axis alignment and are connected in the a-b plane without alignment.

On the other hand, the CAC-OS relates to the material composition of an oxide semiconductor. The CAC-OS refers to a composition in which, in the material composition containing In, Ga, Zn, and O, some regions that include Ga as a main component and are observed as nanoparticles and some regions that include In as a main component and are observed as nanoparticles are randomly dispersed in a mosaic pattern. Therefore, the crystal structure is a secondary element for the CAC-OS.

Note that the CAC-OS is regarded as not including a stacked-layer structure of two or more kinds of films with different compositions. For example, a two-layer structure of a film including In as a main component and a film including Ga as a main component is not included.

Note that a clear boundary cannot sometimes be observed between the region including $GaO_{X3}$ as a main component and the region including $In_{X2}Zn_{Y2}O_{Z2}$ or $InO_{X1}$ as a main component.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that include the metal element(s) as a main component and are observed as nanoparticles and some regions that include In as a main component and are observed as nanoparticles are randomly dispersed in a mosaic pattern.

The CAC-OS can be formed by a sputtering method under a condition where a substrate is not heated intentionally, for example. Moreover, in the case of forming the CAC-OS by a sputtering method, any one or more selected from an inert gas (typically, argon), an oxygen gas, and a nitrogen gas are used as a deposition gas. Furthermore, the ratio of the flow rate of an oxygen gas to the total flow rate of the deposition gas at the time of deposition is preferably as low as possible, and for example, the ratio of the flow rate of the oxygen gas is preferably higher than or equal to 0% and lower than 30%, further preferably higher than or equal to 0% and lower than or equal to 10%.

The CAC-OS is characterized in that no clear peak is observed in measurement using θ/2θ scan by an Out-of-plane method, which is one of X-ray diffraction (XRD) measurement methods. That is, it is found from the X-ray diffraction measurement that no alignment in the a-b plane direction and the c-axis direction is observed in a measured region.

In addition, in an electron diffraction pattern of the CAC-OS which is obtained by irradiation with an electron beam with a probe diameter of 1 nm (also referred to as a nanobeam electron beam), a ring-like high-luminance region (ring region) and a plurality of bright spots in the ring region are observed. It is therefore found from the electron diffraction pattern that the crystal structure of the CAC-OS includes an nc (nano-crystal) structure with no alignment in the plan-view direction and the cross-sectional direction.

Moreover, for example, it can be confirmed by EDX mapping obtained using energy dispersive X-ray spectroscopy (EDX) that the CAC-OS in the In—Ga—Zn oxide has a composition in which regions including $GaO_{X3}$ as a main component and regions including $In_{x2}Zn_{y2}O_{z2}$ or $InO_{X1}$ as a main component are unevenly distributed and mixed.

The CAC-OS has a composition different from that of an IGZO compound in which the metal elements are evenly distributed, and has characteristics different from those of the IGZO compound. That is, in the CAC-OS, the region including $GaO_{X3}$ or the like as a main component and the region including $In_{x2}Zn_{y2}O_{z2}$ or $InO_{X1}$ as a main component are separated to form a mosaic pattern.

Here, a region including $In_{x2}Zn_{y2}O_{z2}$ or $InO_{X1}$ as a main component is a region whose conductivity is higher than that of a region including $GaO_{X3}$ or the like as a main component. In other words, when carriers flow through the regions including $In_{x2}Zn_{y2}O_{z2}$ or $InO_{X1}$ as a main component, the conductivity of an oxide semiconductor is exhibited. Accordingly, when the regions including $In_{x2}Zn_{y2}O_{z2}$ or $InO_{X1}$ as a main component are distributed in an oxide semiconductor like a cloud, high field-effect mobility (μ) can be achieved.

By contrast, a region including $GaO_{X3}$ or the like as a main component is a region whose insulating property is higher than that of a region including $In_{x2}Zn_{y2}O_{z2}$ or $InO_{X1}$ as a main component. In other words, when the regions including $GaO_{X3}$ or the like as a main component are distributed in an oxide semiconductor, leakage current can be suppressed and favorable switching operation can be achieved.

Accordingly, when the CAC-OS is used for a semiconductor element, the insulating property derived from $GaO_{X3}$ or the like and the conductivity derived from $In_{x2}Zn_{y2}O_{z2}$ or $InO_{X1}$ complement each other, whereby a high on-state current (Ion) and high field-effect mobility (μ) can be achieved.

A semiconductor element using the CAC-OS has high reliability. Thus, the CAC-OS is suitably used as a constituent material of a variety of semiconductor devices.

Note that the layer 563 may include a Si transistor. For example, a component included in the pixel circuit can be provided in the layer 563. Furthermore, a circuit for driving the pixel circuit, a circuit for reading out an image signal, an image processing circuit, a memory circuit, or the like can be provided in the layer 562.

In this case, the layer 562 and the layer 563 form a stack structure of layers including Si transistors. In addition, when a pn-junction photodiode with silicon for a photoelectric conversion layer is used for the layer 561, all of the layers can be formed using Si devices.

Figure 13A:
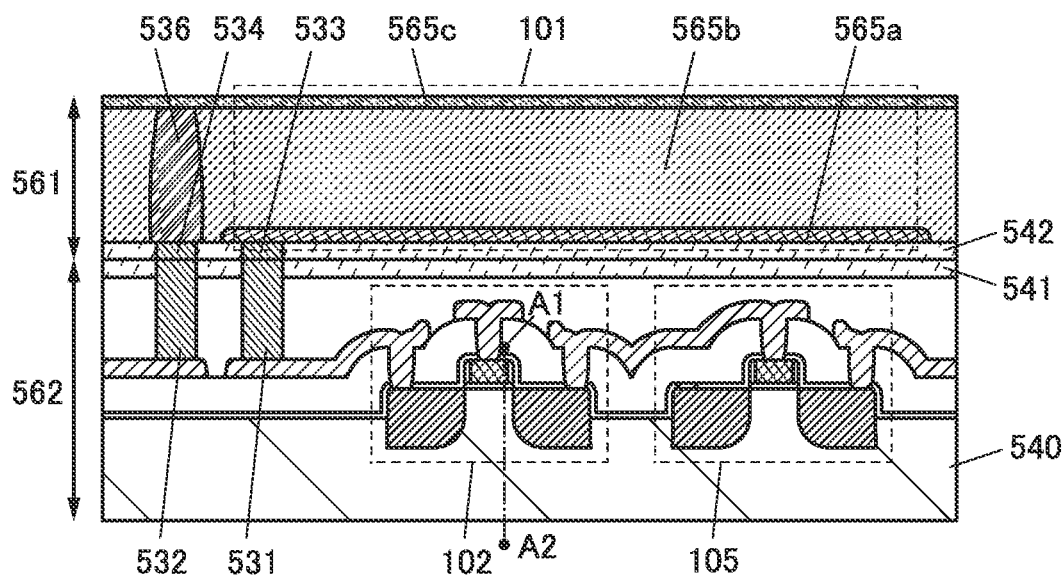
FIG. 13A and FIG. 13B are diagrams illustrating structures of a pixel of an imaging device.

FIG. 13A is a diagram illustrating an example of a cross section of the pixel illustrated in FIG. 12A. The layer 561 includes a pn-junction photodiode with silicon for a photoelectric conversion layer, as the photoelectric conversion device 101. The layer 562 includes Si transistors, and the transistors 102 and 105 included in the pixel circuit are shown as examples in FIG. 13A.

In the photoelectric conversion device 101, the layer 565a can be a p$^+$-type region, the layer 565b can be an n-type region, and the layer 565c can be an n$^+$-type region. The layer 565b is provided with a region 536 for connecting a power supply line to the layer 565c. For example, the region 536 can be a p$^+$-type region.

Figure 14A:
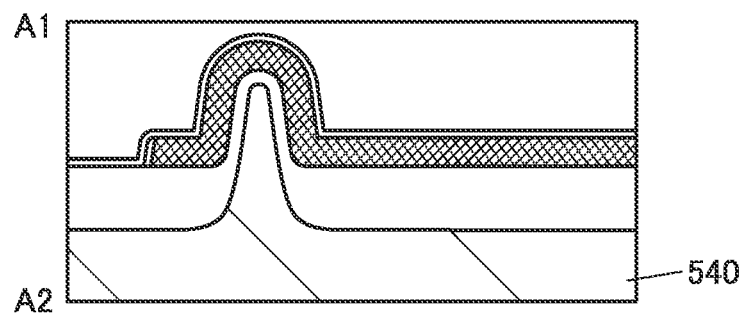
FIG. 14A to FIG. 14C are diagrams illustrating structures of a pixel of an imaging device.
Figure 14B:
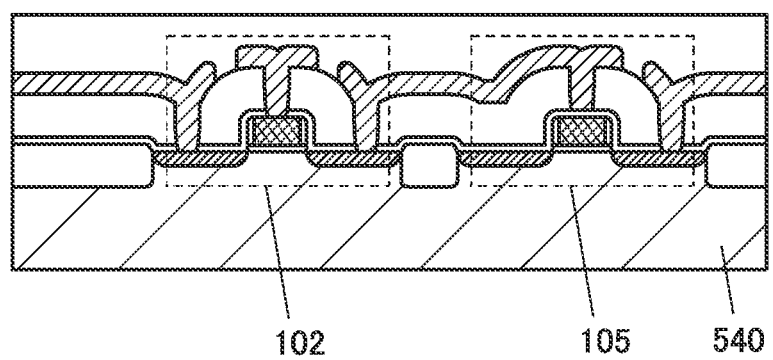

The Si transistors illustrated in FIG. 13A each have a fin-type structure including a channel formation region in a silicon substrate 540, and FIG. 14A shows a cross section in the channel width direction. The Si transistors may each have a planar-type structure as illustrated in FIG. 14B.

Figure 14C:
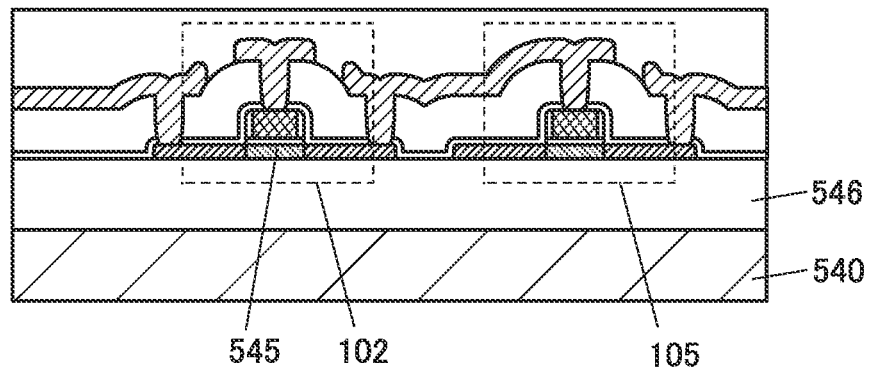

Alternatively, as illustrated in FIG. 14C, transistors each including a semiconductor layer 545 of a silicon thin film may be used. The semiconductor layer 545 can be single crystal silicon (SOI (Silicon on Insulator)) formed on an insulating layer 546 on the silicon substrate 540, for example.

FIG. 13A illustrates an example of a structure in which electrical connection between components included in the layer 561 and components included in the layer 562 is obtained by a bonding technique.

An insulating layer 542, a conductive layer 533, and a conductive layer 534 are provided in the layer 561. The conductive layer 533 and the conductive layer 534 each include a region embedded in the insulating layer 542. The conductive layer 533 is electrically connected to the layer 565a. The conductive layer 534 is electrically connected to the region 536. Furthermore, the surfaces of the insulating layer 542, the conductive layer 533, and the conductive layer 534 are planarized to have the same level.

An insulating layer 541, a conductive layer 531, and a conductive layer 532 are provided in the layer 562. The conductive layer 531 and the conductive layer 532 each include a region embedded in the insulating layer 541. The conductive layer 532 is electrically connected to a power supply line. The conductive layer 531 is electrically connected to the source or the drain of the transistor 102. Furthermore, the surfaces of the insulating layer 541, the conductive layer 531, and the conductive layer 532 are planarized to have the same level.

Here, main components of the conductive layer 531 and the conductive layer 533 are preferably the same metal element. Main components of the conductive layer 532 and the conductive layer 534 are preferably the same metal element. Furthermore, it is preferable that the insulating layer 541 and the insulating layer 542 be formed of the same component.

For example, for the conductive layers 531, 532, 533, and 534, Cu, Al, Sn, Zn, W, Ag, Pt, Au, or the like can be used. Preferably, Cu, Al, W, or Au is used for easy bonding. In addition, for the insulating layers 541 and 542, silicon oxide, silicon oxynitride, silicon nitride oxide, silicon nitride, titanium nitride, or the like can be used.

That is, the same metal material selected from the above is preferably used for the combination of the conductive layer 531 and the conductive layer 533, and the same metal material selected from the above is preferably used for the combination of the conductive layer 532 and the conductive layer 534. Furthermore, the same insulating material selected from the above is preferably used for the insulating layer 541 and the insulating layer 542. With this structure, bonding where a boundary between the layer 561 and the layer 562 is a bonding position can be performed.

This bonding enables electrical connection between the combination of the conductive layer 531 and the conductive layer 533 and between the combination of the conductive layer 532 and the conductive layer 534. In addition, connection between the insulating layer 541 and the insulating layer 542 with mechanical strength can be obtained.

For bonding the metal layers to each other, a surface activated bonding method in which an oxide film, a layer adsorbing impurities, and the like on the surface are removed by sputtering or the like and the cleaned and activated surfaces are brought into contact to be bonded to each other can be used. Alternatively, a diffusion bonding method in which the surfaces are bonded to each other by using temperature and pressure together can be used, for example. Both methods cause bonding at an atomic level, and therefore not only electrically but also mechanically excellent bonding can be obtained.

Furthermore, for bonding the insulating layers to each other, a hydrophilic bonding method or the like can be used; in the method, after high planarity is obtained by polishing or the like, the surfaces of the insulating layers subjected to hydrophilicity treatment with oxygen plasma or the like are arranged in contact with and bonded to each other temporarily, and then dehydrated by heat treatment to perform final bonding. The hydrophilic bonding method can also cause bonding at an atomic level; thus, mechanically excellent bonding can be obtained.

When the layer 561 and the layer 562 are bonded to each other, the insulating layers and the metal layers coexist on their bonding surfaces; therefore, the surface activated bonding method and the hydrophilic bonding method are performed in combination, for example.

For example, a method can be used in which the surfaces are made clean after polishing, the surfaces of the metal layers are subjected to antioxidant treatment and hydrophilicity treatment, and then bonding is performed. Furthermore, hydrophilicity treatment may be performed on the surfaces of the metal layers being hardly oxidizable metal such as Au. Note that a bonding method other than the above-mentioned methods may be used.

Figure 13B:
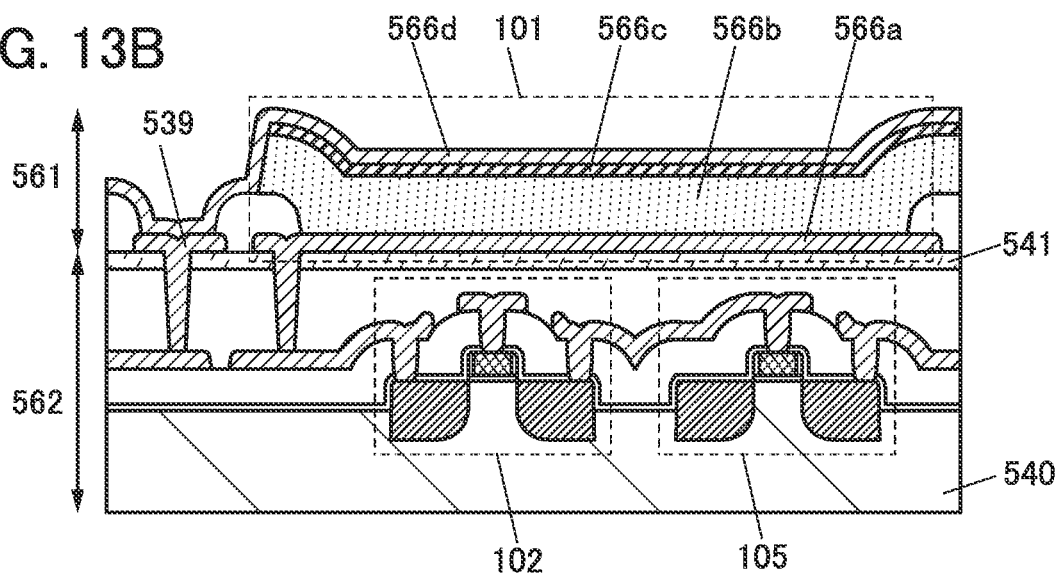

FIG. 13B is a cross-sectional view in the case where a pn-junction photodiode in which a selenium-based material is used for a photoelectric conversion layer is used for the layer 561 of the pixel illustrated in FIG. 12A. The layer 566*a* is included as one electrode, the layers 566*b* and 566*c* are included as a photoelectric conversion layer, and the layer 566*d* is included as the other electrode.

In this case, the layer 561 can be directly formed on the layer 562. The layer 566*a* is electrically connected to the source or the drain of the transistor 102. The layer 566*d* is electrically connected to the power supply line through the conductive layer 539. Note that in the case where an organic optical conductive film is used for the layer 561, the connection mode with the transistor is the same as the above.

Figure 15A:
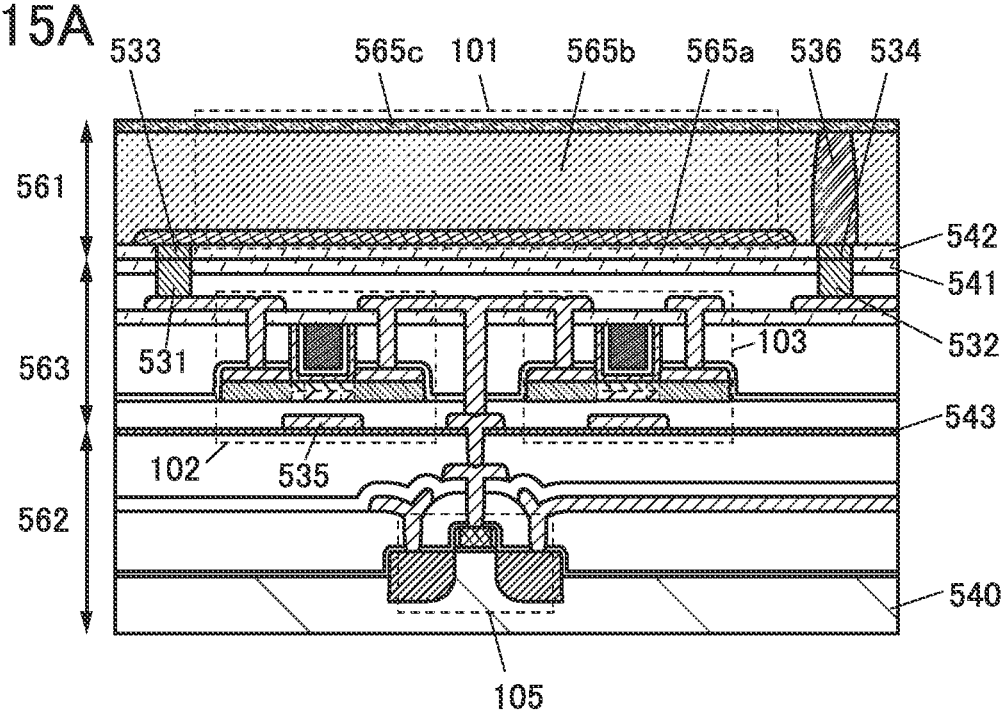
FIG. 15A and FIG. 15B are diagrams illustrating structures of a pixel of an imaging device.

FIG. 15A is a diagram illustrating an example of a cross section of the pixel illustrated in FIG. 12B. The layer 561 includes a pn-junction photodiode with silicon for a photoelectric conversion layer, as the photoelectric conversion device 101. The layer 562 includes Si transistors, and the transistor 105 included in the pixel circuit are shown as examples in FIG. 15A. The layer 563 includes OS transistors, and the transistors 102 and 103 included in the pixel circuit are illustrated as examples. A structure example is illustrated in which electrical connection between the layer 561 and the layer 563 is obtained by bonding.

Figure 16A:
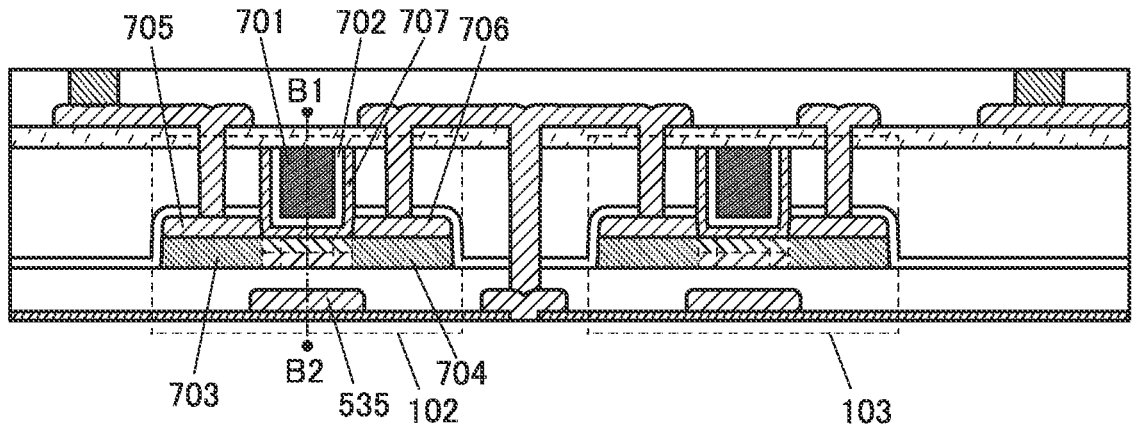
FIG. 16A to FIG. 16D are diagrams illustrating structures of a pixel of an imaging device.

The details of an OS transistor are illustrated in FIG. 16A. The OS transistor illustrated in FIG. 16A has a self-aligned structure in which a source electrode 705 and a drain electrode 706 are formed through provision of an insulating layer over a stacked layer of an oxide semiconductor layer and a conductive layer and provision of grooves reaching the semiconductor layer.

The OS transistor can include a gate electrode 701 and a gate insulating film 702 in addition to a channel formation region, a source region 703, and a drain region 704, which are formed in the oxide semiconductor layer. At least the gate insulating film 702 and the gate electrode 701 are provided in the groove. The groove may further be provided with an oxide semiconductor layer 707.

Figure 16B:
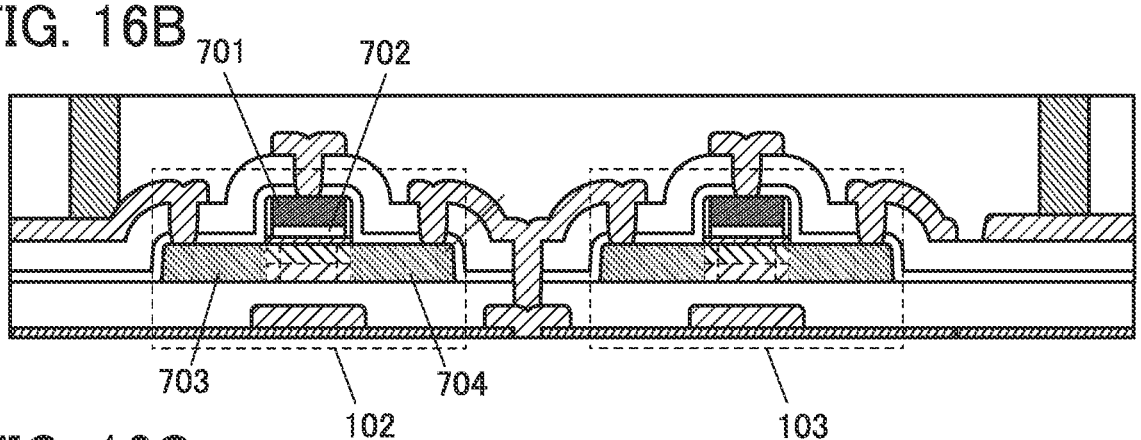

As illustrated in FIG. 16B, the OS transistor may have a self-aligned structure in which the source region and the drain region are formed in the semiconductor layer with the gate electrode 701 as a mask.

Figure 16C:
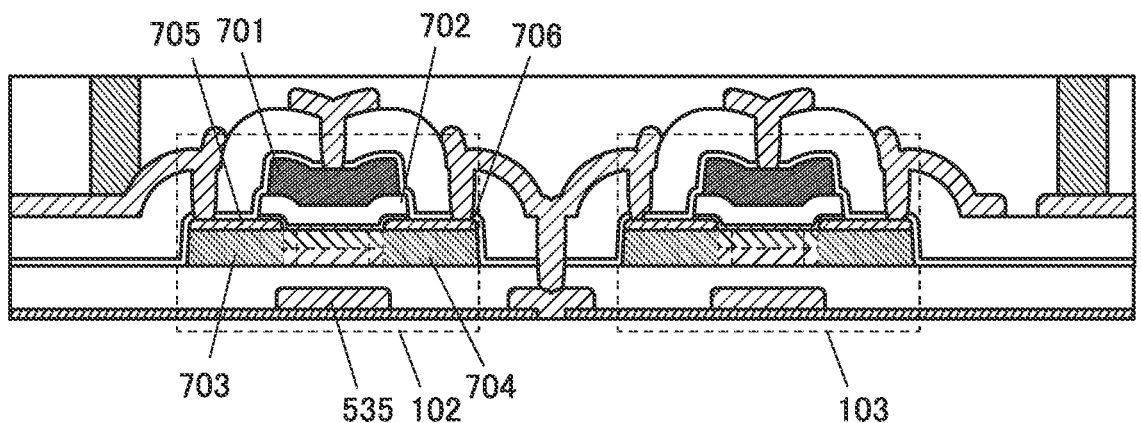

As illustrated in FIG. 16C, the OS transistor may be a non-self-aligned top-gate transistor including a region where the source electrode 705 or the drain electrode 706 overlaps with the gate electrode 701.

Figure 16D:
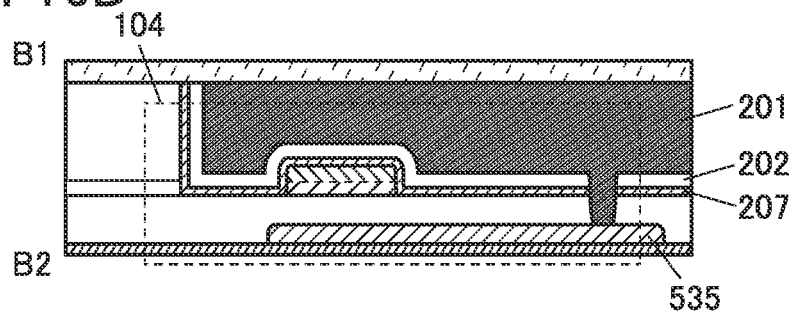

Although the transistors 102 and 103 each have a structure with a back gate 535, they may have a structure without a back gate. As illustrated in a cross-sectional view of the transistor in the channel width direction in FIG. 16D, the back gate 535 may be electrically connected to a front gate of the transistor, which is provided to face the back gate. Note that FIG. 16D illustrates an example of the transistor in FIG. 16A, and the same applies to a transistor having any of the other structures. Different fixed potentials may be supplied to the back gate 535 and the front gate.

An insulating layer 543 that has a function of inhibiting diffusion of hydrogen is provided between a region where OS transistors are formed and a region where Si transistors are formed. Hydrogen in the insulating layer provided in the vicinity of the channel formation region of each of the transistor 105 terminates a dangling bond of silicon. Meanwhile, hydrogen in the insulating layer provided in the vicinity of the channel formation region of each of the transistors 102 and 103 is a factor of generating a carrier in the oxide semiconductor layer.

Hydrogen is confined in one layer using the insulating layer 543, whereby the reliability of the transistor 105 can be improved. Furthermore, diffusion of hydrogen from the one layer to the other layer is inhibited, so that the reliability of the transistors 102 and 103 can also be improved.

For the insulating layer 543, aluminum oxide, aluminum oxynitride, gallium oxide, gallium oxynitride, yttrium oxide, yttrium oxynitride, hafnium oxide, hafnium oxynitride, yttria-stabilized zirconia (YSZ), or the like can be used, for example.

Figure 15B:
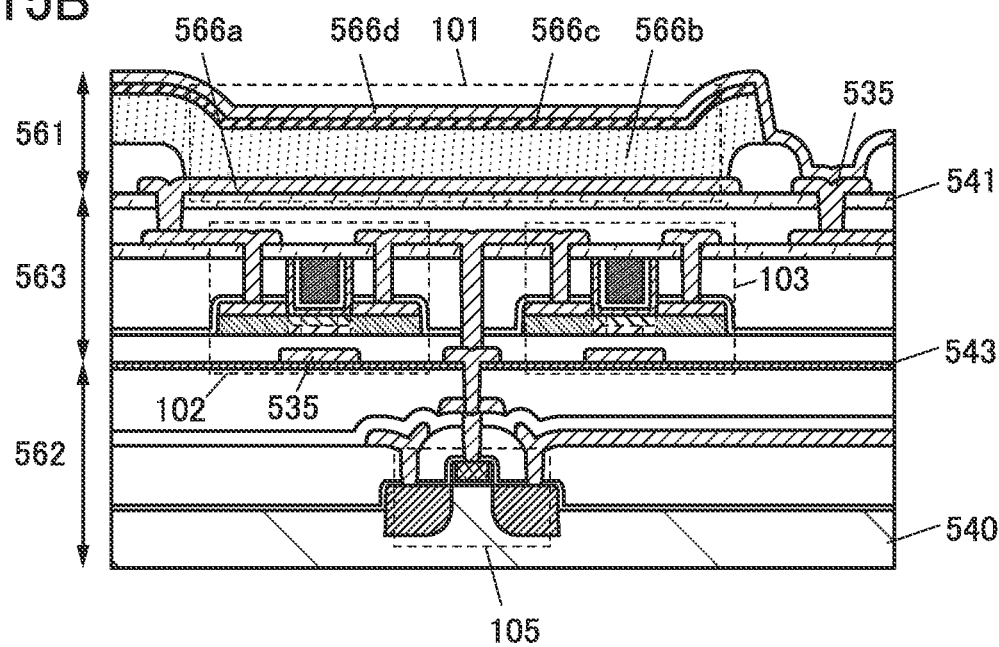

FIG. 15B is a cross-sectional view in the case where a pn-junction photodiode in which a selenium-based material is used for a photoelectric conversion layer is used for the layer 561 of the pixel illustrated in FIG. 12B. The layer 561 can be directly formed on the layer 563. The above description can be referred to for the details of the layers 561, 562, and 563. Note that in the case where an organic optical conductive film is used for the layer 561, the connection mode with the transistor is the same as the above.

Figure 17:
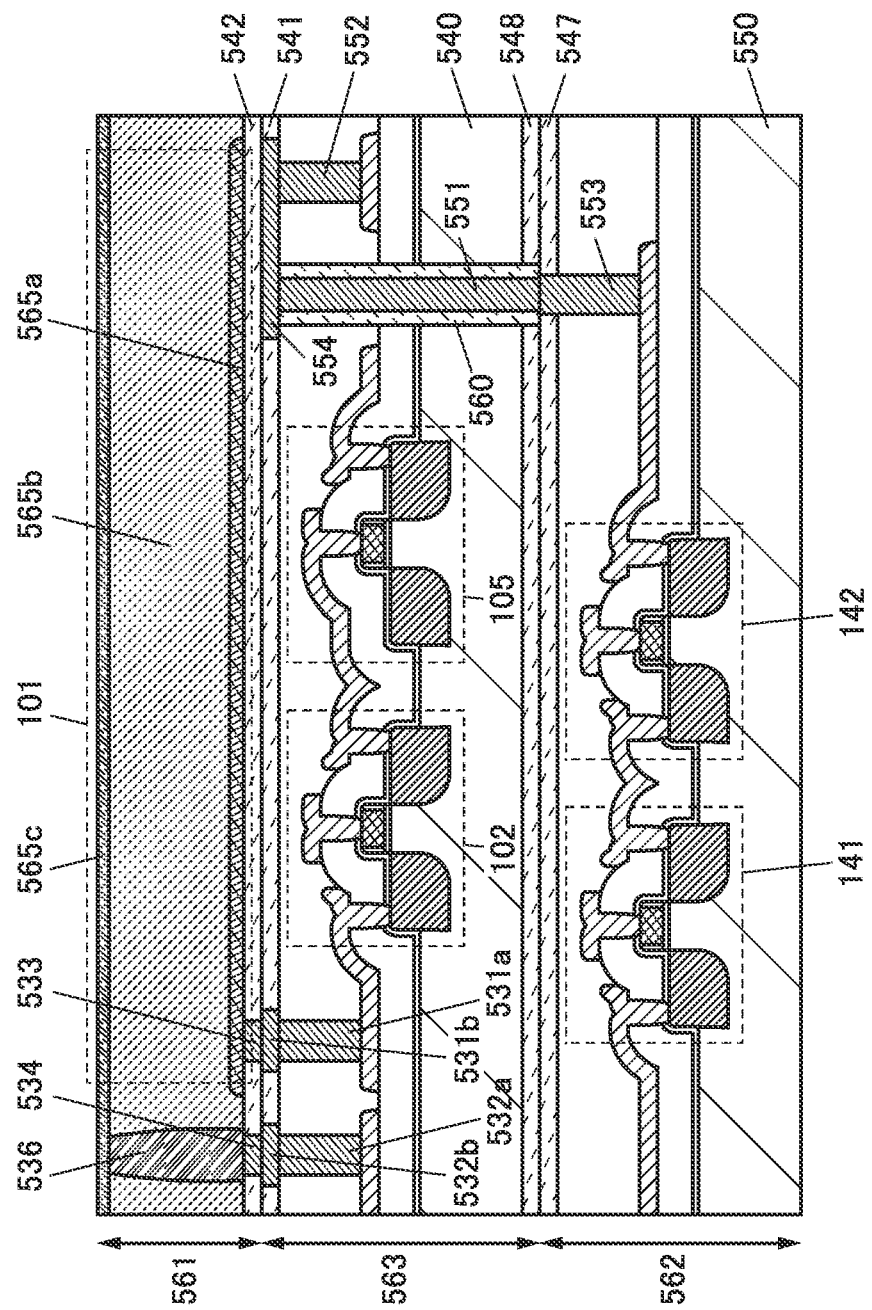
FIG. 17 is a diagram illustrating a structure of a pixel of an imaging device.

FIG. 17 is a diagram illustrating an example of the pixel illustrated in FIG. 12B, which is different from FIG. 15A. In a structure illustrated in FIG. 17, Si devices are provided in all of the layer 561, the layer 563, and the layer 562, and the layers are attached to each other by bonding.

The layer 561 includes a pn-junction photodiode with silicon for a photoelectric conversion layer, as the photoelectric conversion device 101.

The layer 563 includes Si transistors provided on the silicon substrate 540. The transistors 102 and 105 illustrated as examples in FIG. 17 are some components of the pixel circuit.

The layer 562 includes Si transistors provided on a silicon substrate 550. Transistors 141 and 142 illustrated as examples in FIG. 17 are some components of a circuit electrically connected to the pixel circuit.

A conductive layer 531*b*, a conductive layer 532*b*, and a conductive layer 554 are embedded in the insulating layer 541 provided in the layer 563. The conductive layer 531*b*, the conductive layer 532*b*, and the conductive layer 554 are planarized to be level with the insulating layer 541.

The conductive layer 531*b* is electrically connected to the conductive layer 531*a*. The conductive layer 531*a* and the conductive layer 531*b* each have a function equivalent to that of the conductive layer 531 in the structure of FIG. 13A. The conductive layer 531a and the conductive layer 531b can be formed using the same material as that of the conductive layer 531. The conductive layer 531b is electrically connected to the conductive layer 533 included in the layer 561 by bonding.

The conductive layer 532b is electrically connected to the conductive layer 532a. The conductive layer 532a and the conductive layer 532b each have a function equivalent to that of the conductive layer 532 in the structure of FIG. 13A. The conductive layer 532a and the conductive layer 532b can be formed using the same material as that of the conductive layer 532. The conductive layer 532b is electrically connected to the conductive layer 534 included in the layer 561 by bonding.

The conductive layer 554 is electrically connected to a conductive layer 551 and a conductive layer 552. The conductive layer 552 is electrically connected to a wiring connected to the pixel circuit included in the layer 563. The conductive layer 551 is electrically connected to the circuit included in the layer 562. The conductive layer 554, the conductive layer 551, and the conductive layer 552 can be formed using the same material as that of the conductive layer 531.

The conductive layer 551 includes a region embedded in the silicon substrate 540 and an insulating layer 548, and is planarized to be level with the insulating layer 548. Furthermore, the conductive layer 551 includes a region covered with an insulating layer 560 to be insulated from the silicon substrate 540.

A conductive layer 553 includes a region embedded in an insulating layer 547 provided in the layer 562, and is planarized to be level with the insulating layer 547. The conductive layer 553 is electrically connected to the circuit included in the layer 562. The conductive layer 553 can be formed using the same material as that of the conductive layer 531.

By bonding the insulating layer 548 included in the layer 563 and the insulating layer 547 included in the layer 562, the layer 563 and the layer 562 are attached to each other to have mechanical strength. Moreover, by bonding the conductive layer 551 included in the layer 563 and the conductive layer 553 included in the layer 562, the layer 563 and the layer 562 are electrically connected to each other.

Note that FIG. 17 illustrates the structure in which the conductive layer 554 and the conductive layer 553 are connected to each other through the conductive layer 551 passing through the silicon substrate 540; however, the structure is not limited thereto. For example, a structure may be employed in which the conductive layer 551 passing through the silicon substrate 540 is not provided and the conductive layer 554 and the conductive layer 553 are connected to each other in the outside of the silicon substrate 540.

In addition to the driver circuit of the pixel circuit, a memory circuit such as a DRAM (Dynamic Random Access Memory), a neural network, a communication circuit, or the like may be provided in the layer 562, for example. When any of the circuits is provided to overlap with the pixel circuit, delay can be reduced and imaging, image recognition, and the like can be performed at high speed.

Figure 18A:
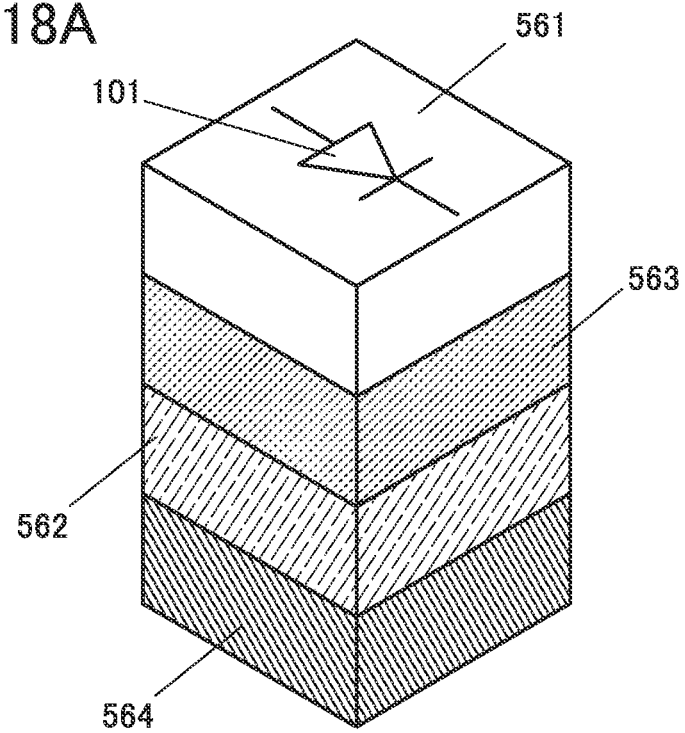
FIG. 18A and FIG. 18B are diagrams illustrating structures of a pixel of an imaging device.
Figure 18B:
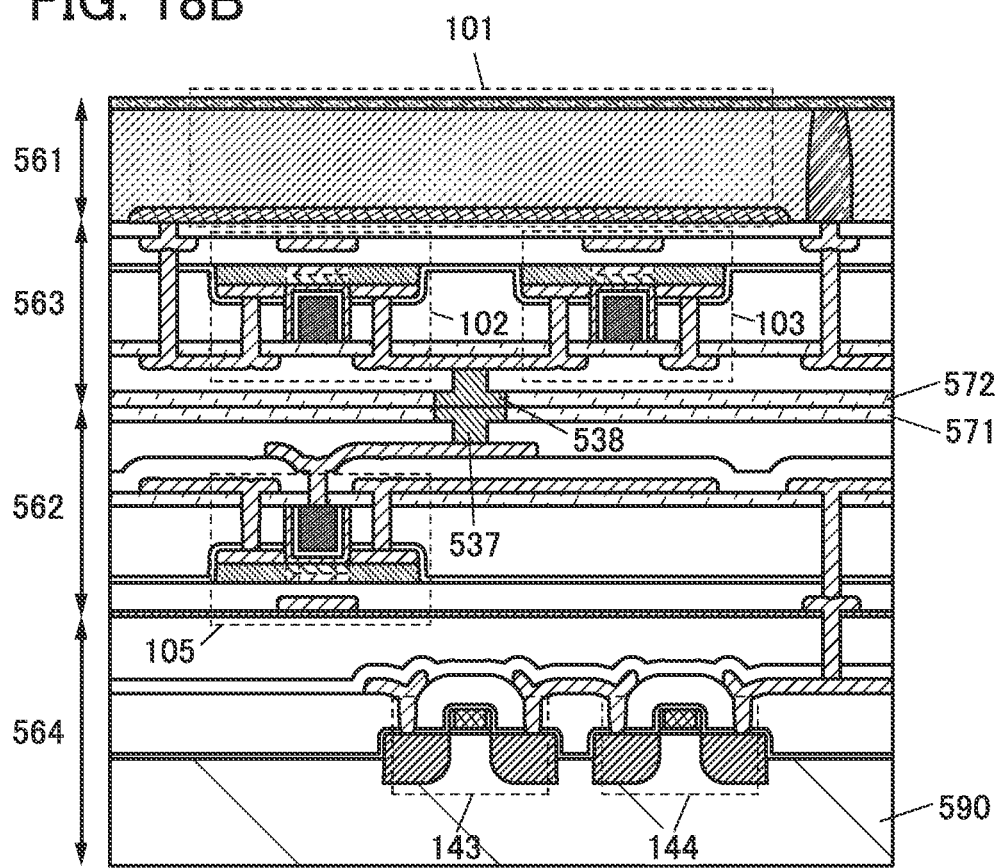

As illustrated in FIG. 18A, the pixel of one embodiment of the present invention may have a stacked-layer structure of the layer 561, the layer 563, the layer 562, and a layer 564. FIG. 18B is a cross-sectional view of an example of the stacked-layer structure.

The layer 561 includes a pn-junction photodiode with silicon for a photoelectric conversion layer, as the photoelectric conversion device 101. The layer 563 and the layer 562 include OS transistors. The layer 564 includes Si transistors 143 and 144 provided on a silicon substrate 590.

The OS transistors included in the layer 563 can be formed over the layer 561. A conductive layer 538 connected to the transistor 102 and the transistor 103 is embedded in an insulating layer 572 provide in the layer 563. The conductive layer 538 is planarized to be level with the insulating layer 572.

The OS transistors included in the layer 562 can be formed over the layer 564. A conductive layer 537 connected to the transistor 105 is embedded in an insulating layer 571 provided in the layer 562. The conductive layer 537 is planarized to be level with the insulating layer 571.

The conductive layer 537 and the conductive layer 538 can be formed using the same material as that of the conductive layer 531. The insulating layer 571 and the insulating layer 572 can be formed using the same material as that of the insulating layer 541.

By bonding the insulating layer 572 included in the layer 563 and the insulating layer 571 included in the layer 562, the layer 563 and the layer 562 are attached to each other to have mechanical strength. Moreover, by bonding the conductive layer 538 included in the layer 563 and the conductive layer 537 included in the layer 562, the layer 563 and the layer 562 are electrically connected to each other.

The structure illustrated in FIG. 18A and FIG. 18B is a four-layer structure (a Si photodiode \ OS transistors \ OS transistors \ Si transistors), which can be formed through one bonding step. An OS transistor can be formed to be stacked over a silicon substrate on which a device is formed, and thus a bonding step can be skipped.

Although an example in which both the layer 562 and the layer 563 include the transistors included in the pixel circuit is illustrated in FIG. 18B, the structure is not limited thereto and one of the layers may include a pixel circuit and the other may include a memory circuit, for example. Furthermore, in addition to the driver circuit of the pixel circuit, a memory circuit such as a DRAM (Dynamic Random Access Memory), a neural network, a communication circuit, a CPU, or the like may be provided in the layer 564, for example.

Furthermore, part of the circuit included in the layer 564 may be formed using OS transistors provided in the layer 562. Since an OS transistor has an extremely low off-state current, a data retention function of a circuit can be increased when the OS transistor is used as a transistor connected to a data retention portion. Accordingly, the frequency of refresh operation of a memory circuit can be reduced, which can reduce power consumption.

A normally-off CPU (also referred to as "Noff-CPU") can be formed using an OS transistor. Note that the Noff-CPU is an integrated circuit including a normally-off transistor, which is in a non-conduction state (also referred to as an off state) even when a gate voltage is 0 V.

In the Noff-CPU, power supply to a circuit that does not need to operate can be stopped so that the circuit can be brought into a standby state. The circuit brought into the standby state because of the stop of power supply does not consume power. Thus, the power usage of the Noff-CPU can be minimized. Moreover, the Noff-CPU can retain data necessary for operation, such as setting conditions, for a long time even when power supply is stopped. The return from the standby state requires only restart of power supply to the circuit and does not require rewriting of setting conditions or the like. In other words, high-speed return from the standby state is possible. As described here, the Noff-CPU can have a reduced power consumption without a significant decrease in operation speed.

Figure 19A:
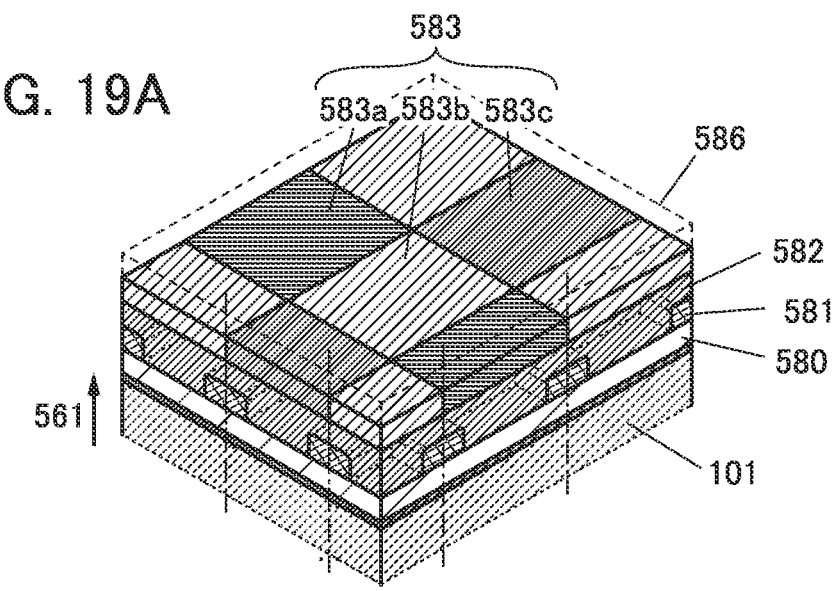
FIG. 19A to FIG. 19C are perspective views illustrating structures of a pixel of an imaging device.

FIG. 19A is a perspective view illustrating an example in which a color filter and the like are added to the pixel of the imaging device of one embodiment of the present invention. The perspective view also illustrates cross sections of a plurality of pixels. An insulating layer 580 is formed over the layer 561 where the photoelectric conversion device 101 is formed. As the insulating layer 580, a silicon oxide film with a high light-transmitting property with respect to visible light can be used, for example. In addition, a silicon nitride film may be stacked as a passivation film. A dielectric film of hafnium oxide or the like may be stacked as an anti-reflection film.

A light-blocking layer 581 may be formed over the insulating layer 580. The light-blocking layer 581 has a function of inhibiting color mixing of light passing through the upper color filter. As the light-blocking layer 581, a metal layer of aluminum, tungsten, or the like can be used. The metal layer and a dielectric film having a function of an anti-reflection film may be stacked.

An organic resin layer 582 can be provided as a planarization film over the insulating layer 580 and the light-blocking layer 581. A color filter 583 (color filters 583a, 583b, and 583c) is formed in each pixel. Color images can be obtained, for example, when colors of R (red), G (green), B (blue), Y (yellow), C (cyan), M (magenta), and the like are assigned to the color filters 583a, 583b, and 583c.

An insulating layer 586 having a light-transmitting property with respect to visible light can be provided over the color filter 583, for example.

Figure 19B:
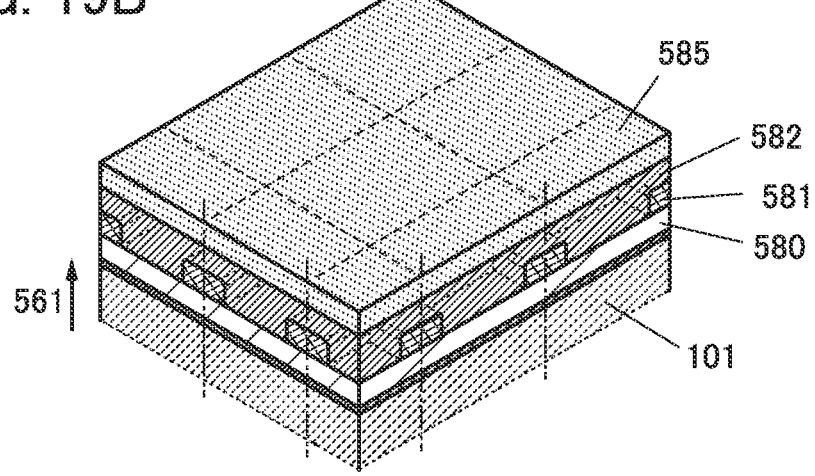

As illustrated in FIG. 19B, an optical conversion layer 585 may be used instead of the color filter 583. Such a structure enables the imaging device to obtain images in various wavelength regions.

For example, when a filter that blocks light having a wavelength shorter than or equal to that of visible light is used as the optical conversion layer 585, an infrared imaging device can be obtained. When a filter that blocks light having a wavelength shorter than or equal to that of near infrared light is used as the optical conversion layer 585, a far-infrared imaging device can be obtained. When a filter that blocks light having a wavelength longer than or equal to that of visible light is used as the optical conversion layer 585, an ultraviolet imaging device can be obtained.

Furthermore, when a scintillator is used as the optical conversion layer 585, an imaging device that obtains an image visualizing the intensity of radiation, which is used for an X-ray imaging device or the like, can be obtained. Radiation such as X-rays passes through an object and enters the scintillator, and then is converted into light (fluorescence) such as visible light or ultraviolet light owing to a photoluminescence phenomenon. Then, the photoelectric conversion device 101 detects the light to obtain image data. Furthermore, the imaging device having this structure may be used in a radiation detector or the like.

A scintillator contains a substance that, when irradiated with radiation such as X-rays or gamma-rays, absorbs energy of the radiation to emit visible light or ultraviolet light. For example, a resin or ceramics in which $Gd_2O_2S$:Tb, $Gd_2O_2S$:Pr, $Gd_2O_2S$:Eu, BaFCl:Eu, NaI, CsI, $CaF_2$, $BaF_2$, $CeF_3$, LiF, LiI, ZnO, or the like is dispersed can be used.

In the photoelectric conversion device 101 containing a selenium-based material, radiation such as X-rays can be directly converted into charge; thus, a structure that does not require a scintillator can be employed.

Figure 19C:
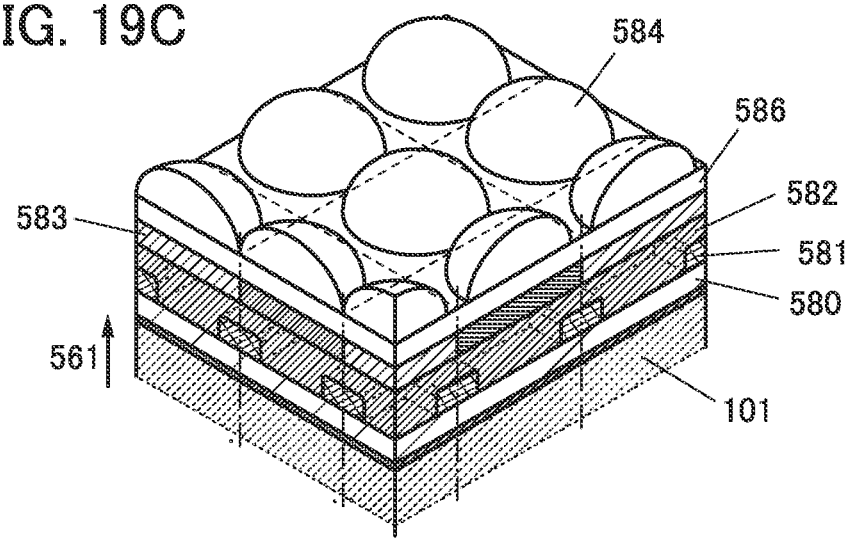

As illustrated in FIG. 19C, a microlens array 584 may be provided over the color filter 583. Light passing through an individual lens of the microlens array 584 goes through the color filter 583 directly under the lens, and the photoelectric conversion device 101 is irradiated with the light. The microlens array 584 may be provided over the optical conversion layer 585 illustrated in FIG. 19B.

Examples of a package and a camera module in each of which an image sensor chip is placed will be described below. For the image sensor chip, the structure of the above imaging device can be used.

FIG. 20A1 is an external perspective view of the top surface side of a package in which an image sensor chip is placed. The package includes a package substrate 410 to which an image sensor chip 450 (see FIG. 20A3) is fixed, a cover glass 420, an adhesive 430 for bonding them, and the like.

FIG. 20A2 is an external perspective view of the bottom surface side of the package. A BGA (Ball grid array) in which solder balls are used as bumps 440 on the bottom surface of the package is employed. Note that, without being limited to the BGA, an LGA (Land grid array), a PGA (Pin Grid Array), or the like may be employed.

FIG. 20A3 is a perspective view of the package, in which parts of the cover glass 420 and the adhesive 430 are not illustrated. Electrode pads 460 are formed over the package substrate 410, and the electrode pads 460 and the bumps 440 are electrically connected to each other via through-holes. The electrode pads 460 are electrically connected to the image sensor chip 450 through wires 470.

FIG. 20B1 is an external perspective view of the top surface side of a camera module in which an image sensor chip is placed in a package with a built-in lens. The camera module includes a package substrate 411 to which an image sensor chip 451 is fixed, a lens cover 421, a lens 435, and the like. Furthermore, an IC chip 490 (see FIG. 20B3) having functions of a driver circuit, a signal conversion circuit, and the like of the imaging device is provided between the package substrate 411 and the image sensor chip 451 (see FIG. 20B3); thus, the structure as an SiP (System in package) is included.

FIG. 20B2 is an external perspective view of the bottom surface side of the camera module. A QFN (Quad flat no-lead package) structure in which lands 441 for mounting are provided on the bottom surface and side surfaces of the package substrate 411 is employed. Note that this structure is only an example, and a QFP (Quad flat package) or the above-mentioned BGA may also be provided.

FIG. 20B3 is a perspective view of the module, in which parts of the lens cover 421 and the lens 435 are not illustrated. The lands 441 are electrically connected to electrode pads 461, and the electrode pads 461 are electrically connected to the image sensor chip 451 or the IC chip 490 through wires 471.

The image sensor chip placed in a package having the above form can be easily mounted on a printed substrate or the like, and the image sensor chip can be incorporated into a variety of semiconductor devices and electronic devices.

This embodiment can be combined with the other embodiments as appropriate.

Embodiment 3

As electronic devices that can include the imaging device of one embodiment of the present invention, display devices, personal computers, image memory devices or image reproducing devices provided with storage media, mobile phones, game machines including portable game machines, portable data terminals, e-book readers, cameras such as video cameras and digital still cameras, goggle-type displays (head mounted displays), navigation systems, audio reproducing devices (car audio players, digital audio players, and the like), copiers, facsimiles, printers, multifunction printers, automated teller machines (ATM), vending machines, and the like are given. Specific examples of these electronic devices are illustrated in FIG. 21A to FIG. 21F.

Figure 21A:
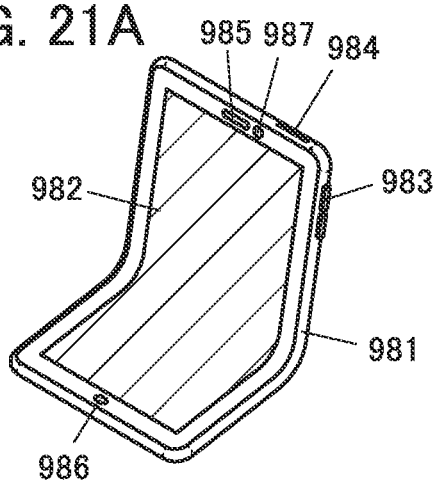
FIG. 21A to FIG. 21F are diagrams illustrating electronic devices.

FIG. 21A is an example of a mobile phone, which includes a housing 981, a display portion 982, an operation button 983, an external connection port 984, a speaker 985, a microphone 986, a camera 987, and the like. The display portion 982 of the mobile phone includes a touch sensor. A variety of operations such as making a call and inputting text can be performed by touch on the display portion 982 with a finger, a stylus, or the like. The imaging device of one embodiment of the present invention and the operation method thereof can be used for obtaining an image in the mobile phone.

Figure 21B:
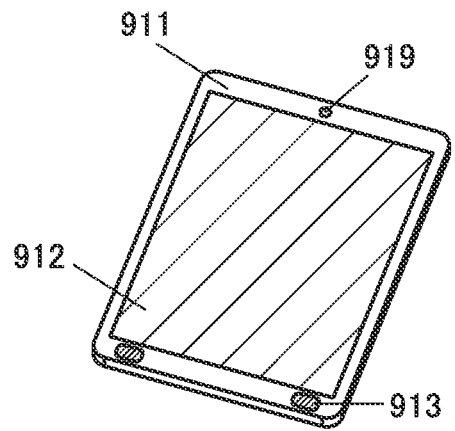

FIG. 21B is a portable data terminal, which includes a housing 911, a display portion 912, a speaker 913, a camera 919, and the like. A touch panel function of the display portion 912 enables input and output of information. Furthermore, a character or the like in an image that is captured by the camera 919 can be recognized and the character can be voice-output from the speaker 913. The imaging device of one embodiment of the present invention and the operation method thereof can be used for obtaining an image in the portable data terminal.

Figure 21C:
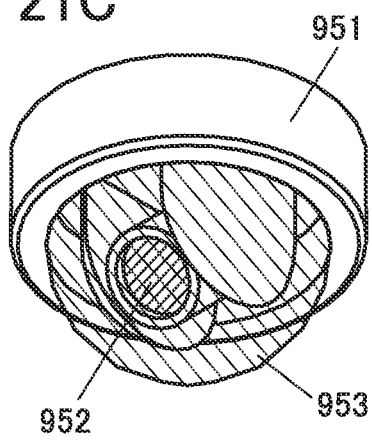

FIG. 21C is a surveillance camera, which includes a support base 951, a camera unit 952, a protection cover 953, and the like. By providing the camera unit 952 provided with a rotating mechanism and the like on a ceiling, an image of all of the surroundings can be taken. The imaging device of one embodiment of the present invention and the operation method thereof can be used for obtaining an image in the camera unit. Note that a surveillance camera is a name in common use and does not limit the use thereof. A device that has a function of a surveillance camera can also be called a camera or a video camera, for example.

Figure 21D:
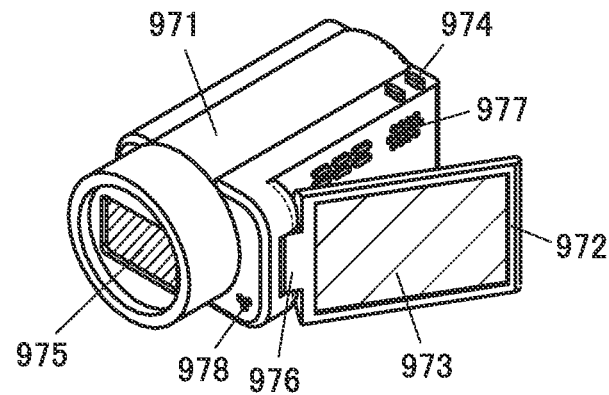

FIG. 21D is a video camera, which includes a first housing 971, a second housing 972, a display portion 973, an operation key 974, a lens 975, a connection portion 976, a speaker 977, a microphone 978, and the like. The operation key 974 and the lens 975 are provided for the first housing 971, and the display portion 973 is provided for the second housing 972. The imaging device of one embodiment of the present invention and the operation method thereof can be used for obtaining an image in the video camera.

Figure 21E:
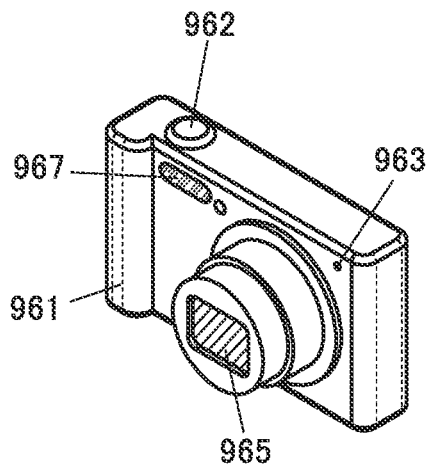

FIG. 21E is a digital camera, which includes a housing 961, a shutter button 962, a microphone 963, a light-emitting portion 967, a lens 965, and the like. The imaging device of one embodiment of the present invention and the operation method thereof can be used for obtaining an image in the digital camera.

Figure 21F:
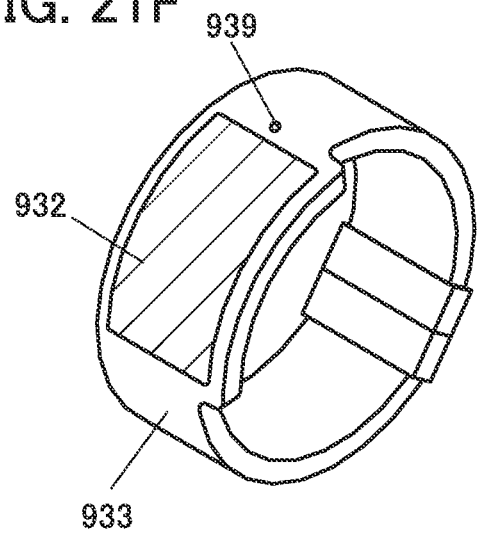

FIG. 21F is a wrist-watch-type information terminal, which includes a display portion 932, a housing and wristband 933, a camera 939, and the like. The display portion 932 is provided with a touch panel for performing the operation of the information terminal. The display portion 932 and the housing and wristband 933 have flexibility and fit a body well. The imaging device of one embodiment of the present invention and the operation method thereof can be used for obtaining an image in the information terminal.

This embodiment can be combined with the other embodiments as appropriate.

REFERENCE NUMERALS

100: pixel, 100a: pixel, 100b: pixel, 100c: pixel, 100d: pixel, 100e: pixel, 100f: pixel, 100g: pixel, 100h: pixel, 101: photoelectric conversion device, 102: transistor, 103: transistor, 104: capacitor, 105: transistor, 106: transistor, 107: transistor, 108: transistor, 111: wiring, 112: wiring, 113: wiring, 114: wiring, 115: wiring, 116: wiring, 117: wiring, 118: wiring, 119: wiring, 120: wiring, 141: transistor, 142: transistor, 161: transistor, 162: transistor, 163: capacitor, 200: pixel block, 200a: pixel block, 200b: pixel block, 200s: pixel block, 201: circuit, 201a: circuit, 201b: circuit, 202: capacitor, 203: transistor, 204: transistor, 205: transistor, 206: transistor, 207: resistor, 211: wiring, 212: wiring, 213: wiring, 215: wiring, 216: wiring, 217: wiring, 218: wiring, 219: wiring, 300: pixel array, 301: circuit, 302: circuit, 303: circuit, 304: circuit, 311: wiring, 320: memory cell, 325: reference memory cell, 330: circuit, 350: circuit, 360: circuit, 370: circuit, 410: package substrate, 411: package substrate, 420: cover glass, 421: lens cover, 430: adhesive, 435: lens, 440: bump, 441: land, 450: image sensor chip, 451: image sensor chip, 460: electrode pad, 461: electrode pad, 470: wire, 471: wire, 490: IC chip, 531: conductive layer, 531a: conductive layer, 531b: conductive layer, 532: conductive layer, 532a: conductive layer, 532b: conductive layer, 533: conductive layer, 534: conductive layer, 535: back gate, 536: region, 537: conductive layer, 538: conductive layer, 539: conductive layer, 540: silicon substrate, 541: insulating layer, 542: insulating layer, 543: insulating layer, 545: semiconductor layer, 546: insulating layer, 547: insulating layer, 548: insulating layer, 550: silicon substrate, 551: conductive layer, 552: conductive layer, 553: conductive layer, 554: conductive layer, 560: insulating layer, 561: layer, 562: layer, 563: layer, 564: layer, 565a: layer, 565b: layer, 565c: layer, 566a: layer, 566b: layer, 566c: layer, 566d: layer, 567a: layer, 567b: layer, 567c: layer, 567d: layer, 567e: layer, 571: insulating layer, 572: insulating layer, 580: insulating layer, 581: light-blocking layer, 582: organic resin layer, 583: color filter, 583a: color filter, 583b: color filter, 583c: color filter, 584: microlens array, 585: optical conversion layer, 586: insulating layer, 590: silicon substrate, 701: gate electrode, 702: gate insulating film, 703: source region, 704: drain region, 705: source electrode, 706: drain electrode, 707: oxide semiconductor layer, 911: housing, 912: display portion, 913: speaker, 919: camera, 932: display portion, 933: housing and wristband, 939: camera, 951: support base, 952: camera unit, 953: protection cover, 961: housing, 962: shutter button, 963: microphone, 965: lens, 967: light-emitting portion, 971: housing, 972: housing, 973: display portion, 974: operation key, 975: lens, 976: connection portion, 977: speaker, 978: microphone, 981: housing, 982: display portion, 983: operation button, 984: external connection port, 985: speaker, 986: microphone, 987: camera

The invention claimed is:
1. An imaging device comprising a pixel, a first circuit, and a second circuit,
wherein the first circuit is configured to supply one of a first potential and a second potential to the pixel,
wherein the second potential is a potential obtained by adding a weight to the first potential,
wherein the pixel is configured to generate first data, wherein, when the first potential is supplied from the first circuit to the pixel, the pixel is configured to output second data to the second circuit on the basis of the first data and the first potential, wherein when the second potential is supplied from the first circuit to the pixel, the pixel is configured to output third data to the second circuit on the basis of the first data and the second potential, and wherein the second circuit is configured to generate fourth data corresponding to a difference between the second data and the third data.

2. The imaging device according to claim 1, wherein the pixel comprises a photoelectric conversion device, a first transistor, a second transistor, a third transistor, a fourth transistor, and a first capacitor, wherein one electrode of the photoelectric conversion device is electrically connected to one of a source and a drain of the first transistor, wherein the other of the source and the drain of the first transistor is electrically connected to one of a source and a drain of the second transistor, wherein the one of the source and the drain of the second transistor is electrically connected to a gate of the third transistor, wherein the gate of the third transistor is electrically connected to one electrode of the first capacitor, wherein the other electrode of the first capacitor is electrically connected to one of a source and a drain of the fourth transistor, wherein the other of the source and the drain of the fourth transistor is electrically connected to the first circuit, and wherein one of a source and a drain of the third transistor is electrically connected to the second circuit.

3. The imaging device according to claim 1, wherein the pixel comprises a photoelectric conversion device, a first transistor, a second transistor, a third transistor, a fourth transistor, and a first capacitor, wherein one electrode of the photoelectric conversion device is electrically connected to one of a source and a drain of the first transistor, wherein the other of the source and the drain of the first transistor is electrically connected to one of a source and a drain of the second transistor, wherein the one of the source and the drain of the second transistor is electrically connected to a first gate of the third transistor, wherein the first gate of the third transistor is electrically connected to one electrode of the first capacitor, wherein the other electrode of the first capacitor is electrically connected to the first circuit, wherein a second gate of the third transistor is electrically connected to one of a source and a drain of the fourth transistor, and wherein one of a source and a drain of the third transistor is electrically connected to the second circuit.

4. The imaging device according to claim 3, wherein the first circuit supplies:
one of the first potential and the second potential to the other electrode of the first capacitor; and
the other of the first potential and the second potential to the other of the source and the drain of the fourth transistor.

5. The imaging device according to claim 3, wherein the third transistor is brought into an on state when a potential higher than or equal to the first potential is supplied to the other electrode of the first capacitor.

6. The imaging device according to claim 1, wherein the second circuit comprises a fifth transistor, a sixth transistor, a seventh transistor, an eighth transistor, a second capacitor, and a resistor, wherein one electrode of the second capacitor is electrically connected to the pixel, wherein the one electrode of the second capacitor is electrically connected to the resistor, wherein the other electrode of the second capacitor is electrically connected to one of a source and a drain of the fifth transistor, wherein the one of the source and the drain of the fifth transistor is electrically connected to a gate of the sixth transistor, wherein one of a source and a drain of the sixth transistor is electrically connected to one of a source and a drain of the seventh transistor, and wherein the one of the source and the drain of the seventh transistor is electrically connected to one of a source and a drain of the eighth transistor.

7. The imaging device according to claim 1, wherein a transistor included in the pixel includes a metal oxide in a channel formation region, and the metal oxide contains In, Zn, and M (M is Al, Ti, Ga, Ge, Sn, Y, Zr, La, Ce, Nd, or Hf).

8. An electronic device comprising the imaging device according to claim 1 and a display device, wherein an image taken by the imaging device is displayed by the display device.

9. An imaging device comprising a pixel, a first circuit, a second circuit, and a third circuit, wherein the first circuit is configured to supply one of a first potential and a second potential to the pixel, wherein the second potential is a potential obtained by adding a weight to the first potential, wherein the pixel is configured to generate first data or second data, wherein, when the first potential is supplied from the first circuit to the pixel,
the pixel is configured to output third data to the second circuit on the basis of the first data and the first potential, and
the pixel is configured to output fourth data to the second circuit on the basis of the second data and the first potential, wherein, when the second potential is supplied from the first circuit to the pixel,
the pixel is configured to output fifth data to the second circuit on the basis of the first data and the second potential, and
the pixel is configured to output sixth data to the second circuit on the basis of the second data and the second potential, wherein the second circuit is configured to generate seventh data corresponding to a difference between the third data and the fifth data and output the seventh data to the third circuit, wherein the second circuit is configured to generate eighth data corresponding to a difference between the fourth data and the sixth data and output the eighth data to the third circuit, and wherein the third circuit is configured to generate ninth data corresponding to a difference between the seventh data and the eighth data.

10. The imaging device according to claim 9,
wherein the pixel comprises a photoelectric conversion device, a first transistor, a second transistor, a third transistor, a fourth transistor, and a first capacitor,
wherein one electrode of the photoelectric conversion device is electrically connected to one of a source and a drain of the first transistor,
wherein the other of the source and the drain of the first transistor is electrically connected to one of a source and a drain of the second transistor,
wherein the one of the source and the drain of the second transistor is electrically connected to a gate of the third transistor,
wherein the gate of the third transistor is electrically connected to one electrode of the first capacitor,
wherein the other electrode of the first capacitor is electrically connected to one of a source and a drain of the fourth transistor,
wherein the other of the source and the drain of the fourth transistor is electrically connected to the first circuit, and
wherein one of a source and a drain of the third transistor is electrically connected to the second circuit.

11. The imaging device according to claim 9,
wherein the pixel comprises a photoelectric conversion device, a first transistor, a second transistor, a third transistor, a fourth transistor, and a first capacitor,
wherein one electrode of the photoelectric conversion device is electrically connected to one of a source and a drain of the first transistor,
wherein the other of the source and the drain of the first transistor is electrically connected to one of a source and a drain of the second transistor,
wherein the one of the source and the drain of the second transistor is electrically connected to a first gate of the third transistor,
wherein the first gate of the third transistor is electrically connected to one electrode of the first capacitor,
wherein the other electrode of the first capacitor is electrically connected to the first circuit,
wherein a second gate of the third transistor is electrically connected to one of a source and a drain of the fourth transistor, and
wherein one of a source and a drain of the third transistor is electrically connected to the second circuit.

12. The imaging device according to claim 11,
wherein the first circuit supplies:
one of the first potential and the second potential to the other electrode of the first capacitor; and
the other of the first potential and the second potential to the other of the source and the drain of the fourth transistor.

13. The imaging device according to claim 11,
wherein the third transistor is brought into an on state when a potential higher than or equal to the first potential is supplied to the other electrode of the first capacitor.

14. The imaging device according to claim 9,
wherein the second circuit comprises a fifth transistor, a sixth transistor, a seventh transistor, an eighth transistor, a second capacitor, and a resistor,
wherein one electrode of the second capacitor is electrically connected to the pixel,
wherein the one electrode of the second capacitor is electrically connected to the resistor,
wherein the other electrode of the second capacitor is electrically connected to one of a source and a drain of the fifth transistor,
wherein the one of the source and the drain of the fifth transistor is electrically connected to a gate of the sixth transistor,
wherein one of a source and a drain of the sixth transistor is electrically connected to one of a source and a drain of the seventh transistor, and
wherein the one of the source and the drain of the seventh transistor is electrically connected to one of a source and a drain of the eighth transistor.

15. The imaging device according to claim 9,
wherein a transistor included in the pixel includes a metal oxide in a channel formation region, and the metal oxide contains In, Zn, and M (M is Al, Ti, Ga, Ge, Sn, Y, Zr, La, Ce, Nd, or Hf).

16. An electronic device comprising the imaging device according to claim 9 and a display device,
wherein an image taken by the imaging device is displayed by the display device.

* * * * *